United States Patent
Moriya et al.

(10) Patent No.: US 9,277,635 B2
(45) Date of Patent: Mar. 1, 2016

(54) METHOD FOR GENERATING EXTREME ULTRAVIOLET LIGHT AND DEVICE FOR GENERATING EXTREME ULTRAVIOLET LIGHT

(71) Applicant: GIGAPHOTON INC., Tochigi (JP)

(72) Inventors: Masato Moriya, Tochigi (JP); Hideyuki Hayashi, Tochigi (JP); Osamu Wakabayashi, Tochigi (JP)

(73) Assignee: GIGAPHOTON INC., Tochigi (JP)

( * ) Notice: Subject to any disclaimer, the term of this patent is extended or adjusted under 35 U.S.C. 154(b) by 0 days.

(21) Appl. No.: 14/643,782

(22) Filed: Mar. 10, 2015

(65) Prior Publication Data

US 2015/0189730 A1  Jul. 2, 2015

Related U.S. Application Data

(63) Continuation of application No. PCT/JP2013/072872, filed on Aug. 27, 2013.

(30) Foreign Application Priority Data

Sep. 11, 2012  (JP) ................................ 2012-199360

(51) Int. Cl.
*H01G 2/00* (2006.01)
*H05G 2/00* (2006.01)
(Continued)

(52) U.S. Cl.
CPC .............. *H05G 2/008* (2013.01); *H01J 37/228* (2013.01); *H01J 37/3045* (2013.01); *H05G 2/005* (2013.01); *H05G 2/006* (2013.01); *H01J 2237/20292* (2013.01)

(58) Field of Classification Search
CPC ....... H05G 2/008; H05G 2/005; H05G 2/006; H01J 37/3045; H01J 37/228; H01J 2237/20292
USPC ...................................................... 250/504 R
See application file for complete search history.

(56) References Cited

U.S. PATENT DOCUMENTS

| 7,068,367 B2 | 6/2006 | Stobrawa et al. |
| 7,589,337 B2 | 9/2009 | Bykanov et al. |

(Continued)

FOREIGN PATENT DOCUMENTS

| JP | 2008-532228 A | 8/2008 |
| JP | 2011-014913 A | 1/2011 |

(Continued)

OTHER PUBLICATIONS

International Search Report PCT/JP2013/072872 dated Sep. 24, 2013 with English translation.

*Primary Examiner* — Michael Maskell
(74) *Attorney, Agent, or Firm* — Studebaker & Brackett PC

(57) ABSTRACT

An extreme ultraviolet light generation device may comprise: a chamber provided with a through-hole; an introduction optical system configured to introduce the pulse laser beam into a first predetermined region inside the chamber through the through-hole; a target supply device configured to output the target toward the first predetermined region; a light source configured to irradiate a second predetermined region with light whose optical path in the second predetermined region has a transverse section that is longer along a direction perpendicular to a direction of movement of the target than along the direction of movement of the target, the second predetermined region including part of a trajectory of the target between the target supply device and the first predetermined region; and an optical sensor configured to detect light incident on the optical sensor from the second predetermined region to detect the target passing through the second predetermined region.

10 Claims, 19 Drawing Sheets

(51) Int. Cl.
*H01J 37/22* (2006.01)
*H01J 37/304* (2006.01)

(56) References Cited

U.S. PATENT DOCUMENTS

2006/0192153 A1 8/2006 Bykanov et al.
2010/0294958 A1* 11/2010 Hayashi ............... H05G 2/006
250/504 R
2012/0080584 A1 4/2012 Partlo et al.
2013/0062539 A1 3/2013 Hayashi et al.

FOREIGN PATENT DOCUMENTS

| JP | 2011-3887 A | 1/2012 |
| JP | 2012-175006 A | 9/2012 |
| WO | 2012/114178 A2 | 8/2012 |

* cited by examiner

*FIG. 1*

METHOD FOR GENERATING EXTREME ULTRAVIOLET LIGHT AND DEVICE FOR GENERATING EXTREME ULTRAVIOLET LIGHT

CROSS REFERENCE TO RELATED APPLICATIONS

This application is a Continuation Application of International Application No. PCT/JP2013/072872 dated Aug. 27, 2013. The subject matter of which is incorporated herein by reference in entirety.

TECHNICAL FIELD

The present disclosure relates to an extreme ultraviolet light generation method and an extreme ultraviolet light generation device.

BACKGROUND ART

In recent years, as semiconductor processes become finer, transfer patterns for use in photolithographies of semiconductor processes have rapidly become finer. In the next generation, microfabrication at 70 nm to 45 nm, and further, microfabrication at 32 nm or less would be demanded. In order to meet the demand for microfabrication at 32 nm or less, for example, it is expected to develop an exposure apparatus in which a system for generating EUV light at a wavelength of approximately 13 nm is combined with a reduced projection reflective optical system.

Three types of EUV light generation systems have been proposed, which include an LPP (laser produced plasma) type system using plasma generated by irradiating a target material with a pulse laser beam, a DPP (discharge produced plasma) type system using plasma generated by electric discharge, and an SR (synchrotron radiation) type system using orbital radiation.

SUMMARY

An extreme ultraviolet light generation method according to an aspect of the present disclosure may be an extreme ultraviolet light generation method for generating extreme ultraviolet light, including: outputting a target from a target supply device toward a first predetermined region inside a chamber, the chamber being provided with a through-hole; detecting the target passing through a second predetermined region by irradiating the second predetermined region with light and by detecting light incident on an optical sensor from the second predetermined region, the second predetermined region including part of a trajectory of the target between the target supply device and the first predetermined region, and the second predetermined region being a region that is longer along a direction perpendicular to a direction of movement of the target and perpendicular to an optical path of the light with which the second predetermined region is irradiated than along the direction of movement of the target; and irradiating the target with a pulse laser beam introduced into the first predetermined region through the through-hole on a basis of a timing of detecting the target passing through the second predetermined region, to turn the target into plasma.

An extreme ultraviolet light generation method according to an aspect of the present disclosure may be an extreme ultraviolet light generation device configured to generate extreme ultraviolet light by turning a target into plasma by irradiating the target with a pulse laser beam, including: a chamber provided with a through-hole; an introduction optical system configured to introduce the pulse laser beam into a first predetermined region inside the chamber through the through-hole; a target supply device configured to output the target toward the first predetermined region; and a target sensor configured to detect the target passing through a second predetermined region by irradiating the second predetermined region with light and by detecting light incident on the target sensor from the second predetermined region, the second predetermined region including part of a trajectory of the target between the target supply device and the first predetermined region, and the second predetermined region being a region that is longer along a direction perpendicular to a direction of movement of the target and perpendicular to an optical path of the light with which the second predetermined region is irradiated than along the direction of movement of the target.

An extreme ultraviolet light generation method according to another aspect of the present disclosure may be an extreme ultraviolet light generation device configured to generate extreme ultraviolet light by turning a target into plasma by irradiating the target with a pulse laser beam, including: a chamber provided with a through-hole; an introduction optical system configured to introduce the pulse laser beam into a first predetermined region inside the chamber through the through-hole; a target supply device configured to output the target toward the first predetermined region; a light source configured to irradiate a second predetermined region with light whose optical path in the second predetermined region has a transverse section that is longer along a direction perpendicular to a direction of movement of the target than along the direction of movement of the target, the second predetermined region including part of a trajectory of the target between the target supply device and the first predetermined region; and an optical sensor configured to detect light incident on the optical sensor from the second predetermined region to detect the target passing through the second predetermined region.

An extreme ultraviolet light generation method according to another aspect of the present disclosure may be an extreme ultraviolet light generation device configured to generate extreme ultraviolet light by turning a target into plasma by irradiating the target with a pulse laser beam, including: a chamber provided with a through-hole; an introduction optical system configured to introduce the pulse laser beam into a first predetermined region inside the chamber through the through-hole; a target supply device configured to output the target toward the first predetermined region; a light source configured to irradiate a second predetermined region with light, the second predetermined region including part of a trajectory of the target between the target supply device and the first predetermined region; a transfer optical system configured to form an image of the target passing through the second predetermined region; and an optical sensor being disposed at a position where the image of the target is formed by the transfer optical system, an optical sensor being configured to detect light incident on a third predetermined region from the transfer optical system to detect the target passing through the second predetermined region, the third predetermined region being longer along a direction perpendicular to a direction of movement of the target than along the direction of movement of the target.

BRIEF DESCRIPTION OF DRAWINGS

Hereinafter, selected embodiments of the present disclosure will be described with reference to the accompanying drawings by way of example.

FIG. 1 schematically illustrates an exemplary configuration of an LPP type EUV light generation system.

DESCRIPTION OF EMBODIMENTS

Figure 2:
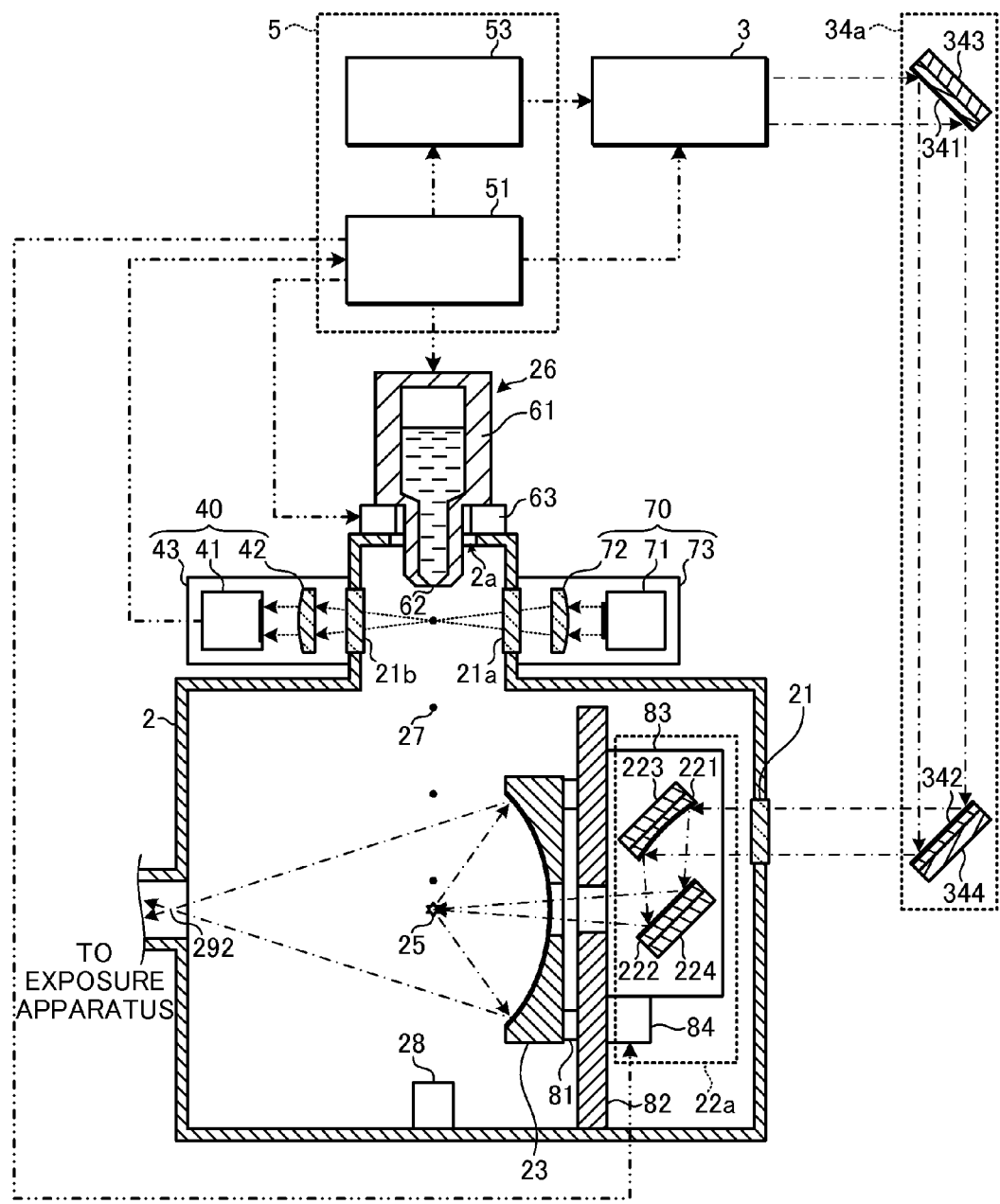
FIG. 2 is a partial cross-sectional view illustrating a configuration of an EUV light generation device according to a first embodiment.

Contents
1. Overview
2. Terms
3. Overview of Extreme Ultraviolet Light Generation System
   3.1 Configuration
   3.2 Operation
4. First Embodiment (Extreme Ultraviolet Light Generation Device Including Target Sensor)
   4.1 Overview of Configuration
   4.2 Details of Target Sensor and Light-emitting Unit
   4.3 Operation of Setting Delay Time
   4.4 First Modification (Transfer to Slit)
   4.5 Second Modification (Detection of Reflected Light)
   4.6 Third Modification (Light-emitting Unit Using Beam Expander)
   4.7 Fourth Modification (Light-emitting Unit Using Slit)
   4.8 Fifth Modification (Target Sensor Using Light Position Sensitive Detector)
   4.9 Sixth Modification (Adjustment of Reference Potential)
   4.10 Seventh Modification (Automatic Adjustment of Reference Potential)
   4.11 Eighth Modification (Automatic Adjustment of Reference Potential)
   4.12 Ninth Modification (Automatic Adjustment of Reference Potential)
   4.13 Tenth Modification (Adjustment of Light-emitting Unit)
5. Second Embodiment (Target Sensor Using Laser Beam Focusing Optical System)
6. Third Embodiment (Light-emitting Unit Using Laser Beam Focusing Optical System)
7. Fourth Embodiment Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Corresponding elements may be referenced by corresponding reference numerals and characters, and duplicate descriptions thereof will be omitted herein.

1. Overview

In an LPP-type EUV light generation device, a target supply device may output a target so that the target reaches a plasma generation region. By a laser apparatus irradiating the target with a pulse laser beam at the point in time when the target reaches the plasma generation region, the target can be turned into plasma and EUV light can be emitted from the plasma.

In order for the laser apparatus to be capable of irradiating the target with the pulse laser beam, a target sensor including a light-receiving element may detect the timing when the target has reached a predetermined region prior to the plasma generation region. A light source may irradiate the target with light so that the target sensor can detect the target.

If an optical path cross-section (transverse section) perpendicular to the travelling direction of the light with which the light source irradiates the target is circular, a shift of an actual path of the target in a direction perpendicular to the travelling direction of the light may cause a shift in the timing when the target is irradiated with the light. Such a shift in the timing when the target is irradiated with the light leads to a shift in the timing when the target sensor detects the target. This may cause a shift in the timing when the laser apparatus irradiates the target with the pulse laser beam.

In one aspect of the present disclosure, the light source may irradiate the target with light whose optical path has a transverse section that is long along a direction perpendicular to a direction of movement of the target. In this aspect, a shift in the timing when the target is irradiated with the light can be suppressed even if the actual path of the target shifts in a direction perpendicular to the travelling direction of the light with which the light source irradiates the target. Therefore, a shift in the timing when the target sensor detects the target can be suppressed.

In another aspect of the present disclosure, an image of the target irradiated with the light by the light source may be formed by a transfer optical system. Moreover, a slit plate having a slit that is long along a direction perpendicular to the direction of movement of the target may be disposed at a position where the image of the target is formed. In this aspect, a shift in the timing when the image of the target is formed at the position within the slit can be suppressed even if the actual path of the target shifts in a direction perpendicular to the travelling direction of the light with which the light source irradiates the target. Therefore, in the case where the target sensor detects the light having passed through the slit, a shift in the timing of detection can be suppressed.

2 Terms

Several terms used in the present application will be described hereinafter.

A "trajectory" of a target may be an ideal path of a target outputted from a target supply device, or may be a path of a target according to the design of a target supply device.

An "actual path" of the target may be a path of a target actually outputted from the target supply device.

A "transverse section of an optical path" may be a cross-sectional profile of a flux of light in a region where light is present, and may for example correspond to the shape of a region where light intensity is $1/e^2$ or higher.

Figure 1:
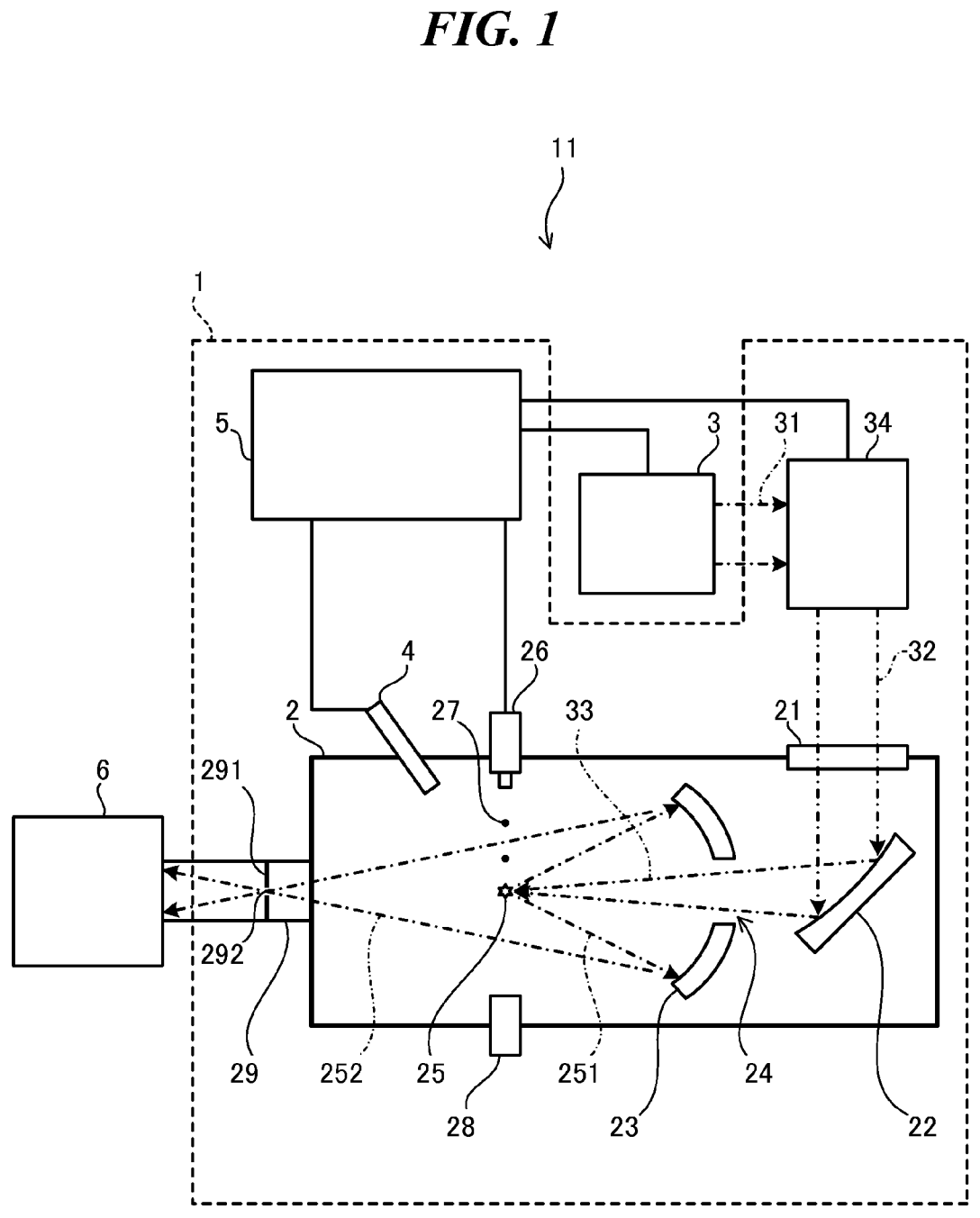

A "first predetermined region" can mean a plasma generation region 25 (FIG. 1).

A "second predetermined region" can mean a region where a target should be positioned in order to be detected by an optical sensor. As an example, a second predetermined region can mean a region 35 (FIGS. 3A and 3B) where light outputted from a light source is focused by a focusing optical system. Another example of a second predetermined region can mean a region 35*a* (FIGS. 5A and 5B) where a target should be positioned in order for an image of the target to be formed at a position within a slit.

A "third predetermined region" can mean a region where an image of a target should be formed in order for the target to be detected by an optical sensor. As an example, a third predetermined region can mean a region within a slit 45*a* (FIG. 5C) of a slit plate disposed between a transfer optical system and an optical sensor. Another example of a third predetermined region can mean a region where a light-receiving unit 47*a* (FIGS. 9A and 9B) of a one-dimensional light position sensitive detector (PSD) receives light.

3. Overview of EUV Light Generation System

3.1 Configuration

FIG. 1 schematically illustrates an exemplary configuration of an LPP type EUV light generation system. An EUV light generation device 1 may be used with at least one laser apparatus 3. Hereinafter, a system that includes the EUV light generation device 1 and the laser apparatus 3 may be referred to as an EUV light generation system 11. As shown in FIG. 1 and described in detail below, the EUV light generation device 1 may include a chamber 2 and a target supply device 26. The chamber 2 may be sealed airtight. The target supply device 26 may be mounted onto the chamber 2, for example, to penetrate a wall of the chamber 2. A target material to be supplied by the target supply device 26 may include, but is not limited to, tin, terbium, gadolinium, lithium, xenon, or a combination of any two or more of them.

The chamber 2 may have at least one through-hole or opening formed in its wall. A window 21 may be located at the through-hole or opening. A pulse laser beam 32 may travel through the window 21. In the camber, an EUV collector mirror 23 having a spheroidal reflective surface may be provided. The EUV collector mirror 23 may have a first focusing point and a second focusing point. The reflective surface of the EUV collector mirror 23 may have a multi-layered reflective film in which molybdenum layers and silicon layers are alternately laminated. The EUV collector mirror 23 may be positioned such that the first focusing point is positioned in a plasma generation region 25 and the second focusing point is positioned in an intermediate focus (IF) region 292. The EUV collector mirror 23 may have a through-hole 24, formed at the center thereof, through which a pulse laser beam 33 travels.

The EUV light generation device 1 may further include an EUV light generation controller 5 and a target sensor 4. The target sensor 4 may have an imaging function and detect at least one of the presence, actual path, position, and speed of a target 27.

Further, the EUV light generation device 1 may include a connection part 29 for allowing the interior of the chamber 2 to be in communication with the interior of the exposure apparatus 6. A wall 291 having an aperture 293 may be provided in the connection part 29. The wall 291 may be positioned such that the second focus of the EUV collector mirror 23 lies in the aperture 293 formed in the wall 291.

The EUV light generation device 1 may also include a laser beam direction control unit 34, a laser beam focusing mirror 22, and a target collector 28 for collecting targets 27. The laser beam direction control unit 34 may include an optical element (not separately shown) for defining the direction into which the pulse laser beam 32 travels and an actuator (not separately shown) for adjusting the position and the orientation or posture of the optical element.

3.2 Operation

With continued reference to FIG. 1, a pulse laser beam 31 outputted from the laser apparatus 3 may pass through the laser beam direction control unit 34 and be outputted therefrom as the pulse laser beam 32. The pulse laser beam 32 may travel through the window 21 and enter the chamber 2. The pulse laser beam 32 may travel inside the chamber 2 along at least one beam path, be reflected by the laser beam focusing mirror 22, and strike at least one target 27 as a pulse laser beam 33.

The target supply device 26 may be configured to output the target(s) 27 toward the plasma generation region 25 in the chamber 2. The target 27 may be irradiated with at least one pulse of the pulse laser beam 33. Upon being irradiated with the pulse laser beam 33, the target 27 may be turned into plasma, and EUV light 251 may be emitted from the plasma. The EUV light 251 may be reflected and focused by the EUV collector mirror 23. EUV light 252, which is the light reflected by the EUV collector mirror 23, may travel through the intermediate focus region 292 and be outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control at least one of: the timing when the target 27 is outputted and the direction into which the target 27 is outputted. Furthermore, the EUV light generation controller 5 may be configured to control at least one of: the timing when the laser apparatus 3 oscillates, the direction in which the pulse laser beam 32 travels, and the position at which the pulse laser beam 33 is focused. The various controls mentioned above are merely examples, and other controls may be added as necessary.

4. First Embodiment (EUV Light Generation Device Including Target Sensor

4.1 Overview of Configuration

FIG. 2 is a partial cross-sectional view illustrating the configuration of an EUV light generation device according to a first embodiment. As shown in FIG. 2, a laser beam focusing optical system 22a, the EUV collector mirror 23, the target collector 28, an EUV collector mirror holder 81, and plates 82 and 83 may be provided within the chamber 2.

The chamber 2 may include a member (electrically-conductive member) made of a material having electrical conductivity (e.g. a metal material). Alternatively, the chamber 2 may include an electrically-conductive member and a member having electrical insulation. The plate 82 may be anchored to the chamber 2. The plate 83 may be anchored to the plate 82 through a triaxial stage 84. The EUV collector mirror 23 may be anchored to the plate 82 through the EUV collector mirror holder 81.

The laser beam focusing optical system 22a may include an off-axis paraboloid mirror 221, a flat mirror 222, and holders 223 and 224. The off-axis paraboloid mirror 221 and the flat mirror 222 may be held by the holders 223 and 224, respectively. The holders 223 and 224 may be anchored to the plate 83. The triaxial stage 84 may be capable of changing the position and orientation of the plate 83. By changing the position and orientation of the plate 83, the positions and orientations of the off-axis paraboloid mirror 221 and the flat mirror 222 can be adjusted. The positions and orientations of the off-axis paraboloid mirror 221 and the flat mirror 222 may be adjusted so that a pulse laser beam reflected by these mirrors is focused at the plasma generation region (first predetermined region) 25. The target collector 28 may be disposed upon a straight line extending from the trajectory of the target 27.

The target supply device 26 may be attached to the chamber 2. The target supply device 26 may include a reservoir 61. The reservoir 61 may hold a target material in a melted state in its interior. An opening 62 that communicates with the interior of the reservoir 61 may be formed in the target supply device 26. Part of the reservoir 61 may be inserted into a through-hole 2a formed in a wall of the chamber 2 so that the opening 62 formed in the target supply device 26 is positioned inside the chamber 2. The target supply device 26 may supply the melted target material to the interior of the chamber 2 as droplet-shaped targets 27 via the opening 62.

The target supply device 26 may further include a dual-axis stage 63. The dual-axis stage 63 may be capable of moving the positions of the reservoir 61 and the opening 62 in a left-right direction and a depth direction in FIG. 2 relative to the chamber 2. A sealing means (not shown) may be disposed between the periphery of the through-hole 2a and the reservoir 61. This sealing means may form an airtight seal between the periphery of the through-hole 2a and the reservoir 61.

A target sensor 40 and a light-emitting unit 70 may be attached to the chamber 2. The target sensor 40 may include an optical sensor 41, a focusing optical system 42, and a plate 43. The plate 43 may be anchored to an outer part of the chamber 2, and the optical sensor 41 and the focusing optical system 42 may be anchored to the plate 43. The light-emitting unit 70 may include a light source 71, a focusing optical system 72, and a plate 73. The plate 73 may be anchored to the outer part of the chamber 2, and the light source 71 and the focusing optical system 72 may be anchored to the plate 73.

The target sensor 40 and the light-emitting unit 70 may be disposed on the opposite sides to each other with the trajectory of the target 27 therebetween. Windows 21a and 21b may be attached to the chamber 2. The window 21a may be positioned between the light-emitting unit 70 and the trajectory of the target 27. The light-emitting unit 70 may focus light at a predetermined position on the trajectory of the target 27 through the window 21a. The window 21b may be positioned between the trajectory of the target 27 and the target sensor 40. When the target 27 passes through the position at which the light-emitting unit 70 focuses light, the target sensor 40 may detect a change in light traveling through the trajectory of the target 27 and the periphery thereof and output a target detection signal.

In the case where the light-emitting unit 70 is positioned inside the chamber 2, the window 21a does not need to be provided. In the case where the target sensor 40 is positioned inside the chamber 2, the window 21b does not need to be provided. Further, instead of the window 21a and the focusing optical system 72, a window (not illustrated) having the shape of a focusing element may be installed, and the window having the shape of a focusing element may function both as the window 21a and the focusing optical system 72. Instead of the window 21b and the focusing optical system 42, a window (not illustrated) having the shape of a focusing element may be installed, and the window having the shape of a focusing element may function both as the window 21b and the focusing optical system 42.

The laser beam direction control unit 34a and the EUV light generation controller 5 may be provided outside the chamber 2. The laser beam direction control unit 34a may include high-reflecting mirrors 341 and 342, as well as holders 343 and 344. The high-reflecting mirrors 341 and 342 may be held by the holders 343 and 344, respectively.

Here, the laser beam focusing optical system 22a and the laser beam direction control unit 34a may serve as an introduction optical system.

The EUV light generation controller 5 may include an EUV controller 51 and a delay circuit 53. The EUV controller 51 may output a control signal to the delay circuit 53 and the laser apparatus 3. The EUV controller 51 may output a target supply start signal to the target supply device 26 so that the target supply device 26 starts to supply the target 27 into the chamber 2. The EUV controller 51 may output, to the delay circuit 53, the target detection signal outputted from the target sensor 40. In the case where the exposure apparatus 6 (see FIG. 1) has outputted information of a targeted position where the EUV light is to be generated, the EUV controller 51 may receive that targeted position information. A region including the targeted position and the periphery thereof may be taken as the plasma generation region (first predetermined position) 25. The EUV controller 51 may control the triaxial stage 84 and the dual-axis stage 63 based on the targeted position information.

The delay circuit 53 may output a timing signal to the laser apparatus 3 so that the target 27 is irradiated with the pulse laser beam at the timing when the target 27 reaches the vicinity of the plasma generation region 25. This timing signal may be a signal obtained by imparting a predetermined delay time to the target detection signal.

4.2 Details of Target Sensor and Light-Emitting Unit

Figure 3A:
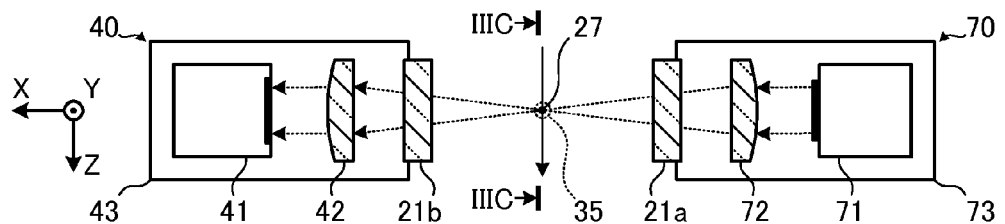
FIG. 3A is an enlarged partial cross-sectional view illustrating a target sensor and a light-emitting unit illustrated in FIG. 2.
Figure 3B:
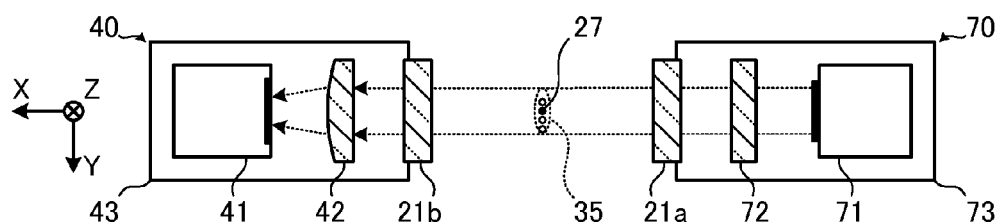
FIG. 3B is a partial cross-sectional view of the target sensor and the light-emitting unit illustrated in FIG. 3A, as viewed from an upstream side in a direction of movement of a target.
Figure 3C:
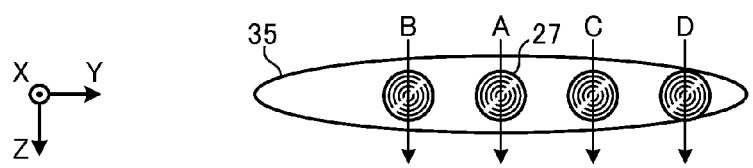
FIG. 3C illustrates a cross-section taken along a line IIIC-IIIC perpendicular to a travelling direction of light generated by the light-emitting unit illustrated in FIG. 3A.
Figure 3D:
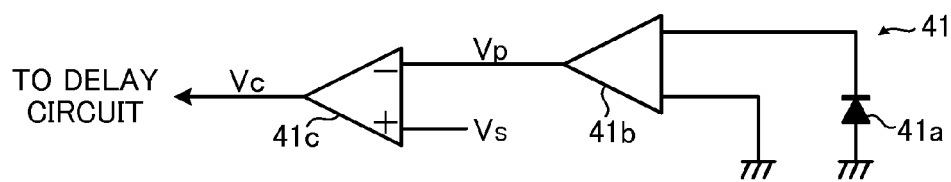
FIG. 3D is a circuit diagram of an optical sensor illustrated in FIG. 3A.
Figure 3E:
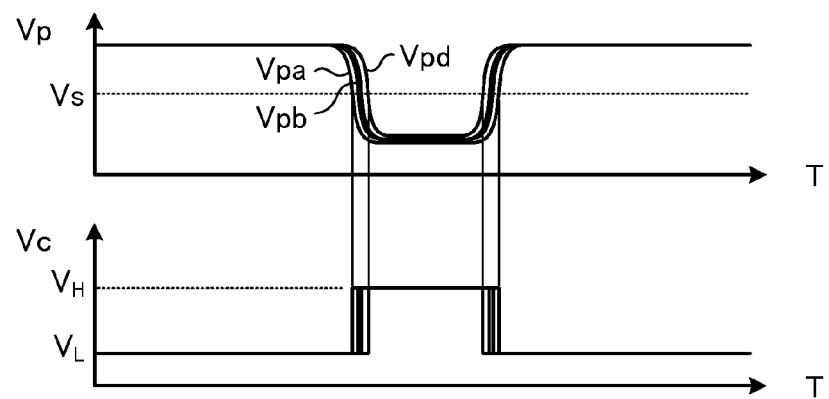
FIG. 3E is a waveform chart of signals in the respective parts of a circuit illustrated in FIG. 3D.

FIG. 3A is an enlarged partial cross-sectional view illustrating a target sensor and a light-emitting unit illustrated in FIG. 2. FIG. 3B is a partial cross-sectional view of the target sensor and the light-emitting unit illustrated in FIG. 3A, as viewed from an upstream side in a direction of movement of a target. FIG. 3C illustrates a cross-section taken along a line IIIC-IIIC perpendicular to the travelling direction of light generated by the light-emitting unit illustrated in FIG. 3A. FIG. 3D is a circuit diagram of an optical sensor illustrated in FIG. 3A. FIG. 3E is a waveform chart of signals in the respective parts of a circuit illustrated in FIG. 3D.

As shown in FIGS. 3A and 3B, the travelling direction of light from the light source 71 may be an K direction. The focusing optical system 72 may be a lens in which a curvature of its surface in a Z direction and a curvature of its surface in a Y direction are different from each other. The focusing optical system 72 may for example be a plano-convex cylindrical lens having a plane surface and a convex surface. The plano-convex cylindrical lens may be disposed so that the curvature of the convex surface in the Z direction takes on a predetermined value that is greater than 0 and the curvature of the convex surface in the Y direction is substantially 0. The focusing optical system 72 may cause the light from the light source 71 to be focused at a predetermined position on the trajectory of the target 27. A region 35 at which the light from the light source 71 is focused by the focusing optical system 72 is here taken as a second predetermined region. The region 35 may have a shape that is longer along the Y direction than along the Z direction. In FIGS. 3A and 3B, the area of the region 35 is made to be shown bigger than it actually is for easier viewing. However, the area of the region 35 may be smaller than the area illustrated. When light whose optical path has a circular transverse section is emitted from the light source 71 and incident on the focusing optical system 72, the transverse section of the optical path in the region 35 may, as shown in FIG. 3C, be in the shape of an ellipse whose long-axis direction is substantially coincident with the Y direction.

As shown in FIG. 3C, when the target 27 moves in the Z direction and the target 27 has reached the region 35, a portion of the light outputted from the light-emitting unit 70 toward the target sensor 40 may be blocked by the target 27. This can lower the amount of light incident on the target sensor 40.

As shown in FIG. 3D, the optical sensor 41 may include a light-receiving element 41a, an amplifier 41b, and a comparator 41c. The light-receiving element 41a (e.g. a photodiode) may be capable of outputting a voltage signal in accordance with the amount of incident light from the outside. The light-receiving element 41a may be connected to an input terminal of the amplifier 41b. The amplifier 41b may amplify the voltage signal outputted from the light-receiving element 41a and output an output signal Vp. An output terminal of the amplifier 41b may be connected to a negative input terminal of the comparator 41c. A constant reference potential Vs may be applied to a positive input terminal of the comparator 41c.

In FIG. 3E, the horizontal axis represents time T, and the vertical axes of the upper and lower waveform charts represent the output signal Vp from the amplifier 41b and a detection signal Vc that is outputted from the comparator 41c, respectively. As shown in FIG. 3E, the output signal Vp from the amplifier 41b can take on a lower potential when the target 27 has reached the region 35 than when the target 27 has not reached the region 35. This can be because the amount of light that is received by the light-receiving element 41a decreases when the target 27 has reached the region 35. When the target 27 has passed through the region 35, the output signal Vp from the amplifier 41b can return to its original potential. The reference potential Vs may be set between a potential of the output signal Vp at the time when the target 27 has not reached the region 35 and a potential of the output signal Vp at the time when the target 27 has reached the region 35.

The detection signal Vc that is outputted from the comparator 41c can take on a first potential $V_L$ in a state where the output signal Vp takes on a potential that is higher than the reference potential Vs. When the output signal Vp takes on a potential that is lower than the reference potential Vs, the detection signal Vc can take on a second potential $V_H$. When the output signal Vp returns to its original high potential, the detection signal Vc can return to the first potential $V_L$. The detection signal Vc may be inputted as the aforementioned target detection signal to the delay circuit 53 via the EUV controller 51 (FIG. 2) or a buffer circuit (not illustrated). The delay circuit 53 may output a timing signal to the laser apparatus 3 in accordance with the timing when the detection signal Vc changes for example from the first potential $V_L$ to the second potential $V_H$. Alternatively, the delay circuit 53 may output a timing signal to the laser apparatus 3 in accordance with the timing when the detection signal Vc changes from the second potential $V_H$ to the first potential $V_L$.

There can be a case where an actual path of the target 27 is shifted in the Y direction with respect to the trajectory of the target 27. This can be attributed to a change in state (such as wettability) of the periphery of the opening 62 formed in the target supply device 26. Further, this can also be attributed to a movement of the target supply device 26 by the dual-axis stage 63. As shown in FIG. 3C, there can be a case where the actual path of the target 27 passes through substantially the center of the region 35 (actual path A) and a case where the actual path of the target 27 passes through a position slightly shifted in the Y direction from the center of the region 35 (actual path B, actual path C). Further, there can also be a case where the actual path of the target 27 passes through the vicinity of an end of the region 35 (actual path D).

The length of time for which the target 27 blocks a portion of the light from the light-emitting unit 70 can be slightly shorter in the case where the actual path of the target 27 passes through a position slightly shifted in the Y direction (actual path B, actual path C) than in the case where the actual path of the target 27 passes through substantially the center of the region 35 (actual path A). The length of time for which the target 27 blocks a portion of the light from the light-emitting unit 70 can be even shorter, albeit slightly, in the case where the actual path of the target 27 passes through the vicinity of an end of the region 35 (actual path D). In FIG. 3E, Vpa represents an output signal from the amplifier 41b in the case where the actual path of the target 27 passes through substantially the center of the region 35 (actual path A). Further, Vpb represents an output signal from the amplifier 41b in the case where the actual path of the target 27 passes through a position slightly shifted in the Y direction (actual path B, actual path C), and Vpd represents an output signal from the amplifier 41b in the case where the actual path of the target 27 passes through the vicinity of an end of the region 35 (actual path D).

In the first embodiment, the length of the region 35 along the Y direction is longer than the length of the region 35 along the Z direction. Through this, even if the actual path of the target 27 is shifted in the Y direction with respect to the trajectory of the target 27, a shift in the timing when the target 27 reaches the region 35 can be better suppressed than in the case where the length of the region 35 along the Z direction and the length of the region 35 along the Y direction are equal. Therefore, even if the actual path of the target 27 is shifted in the Y direction, a shift in the timing when the detection signal Vc changes from the first potential $V_L$ to the second potential $V_H$ can be suppressed. Further, a shift in the timing when the detection signal Vc changes from the second potential $V_H$ to the first potential $V_L$ can be suppressed. Through this, a shift in the timing when the laser apparatus 3 outputs a pulse laser beam is suppressed, so that the target 27 can be irradiated with the pulse laser beam at an appropriate timing.

The light source 71 may be a semiconductor laser. Light generated by the light source 71 may be infrared light, but it is more desirable that the light be visible light. Shortening of the wavelength of the light can deepen the depth of focus. In that case, a shift in the timing of the detection signal can be suppressed even in the case where the actual path of the target 27 is shifted in the travelling direction of the light (the K direction) with respect to the trajectory of the target 27.

4.3 Operation of Setting Delay Time

Figure 4:
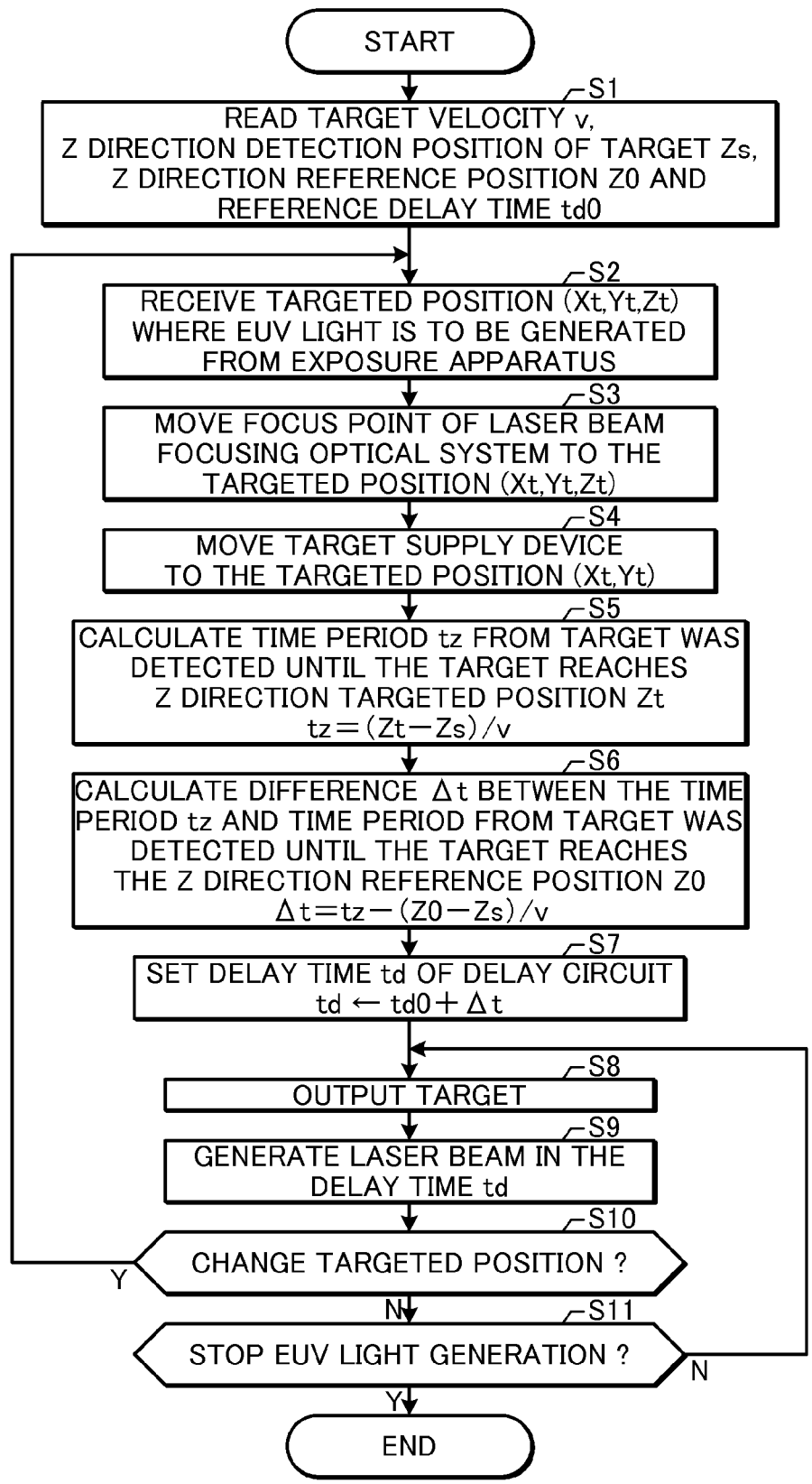
FIG. 4 is a flowchart illustrating an operation of an EUV controller in the first embodiment.

FIG. 4 is a flowchart illustrating an operation of the EUV controller 51 in the first embodiment. In order for a target to be irradiated with a pulse laser beam at an optimum timing, the EUV controller 51 may set delay time through the following process.

The EUV controller 51 may read, from a memory (not illustrated), a target velocity v, the Z direction detection position Zs of a target to be detected, a Z direction reference position Z0, which serves as a reference for setting of delay time, and a reference delay time td0 with respect to the Z direction reference position Z0 (step S1). The target velocity v may be a value actually measured by using a measuring apparatus (not illustrated) of the EUV light generation device. The Z direction detection position Zs may be a value that is defined by the positions at which the target sensor 40 and the light-emitting unit 70 are mounted. The reference delay time td0 may be the delay time of a timing signal with respect to a target detection signal, and may be the delay time that is set in the case where EUV light is generated at the Z direction reference position Z0.

Next, the EUV controller 51 may receive, from the exposure apparatus 6, a targeted position (Xt, Yt, Zt) where the EUV light is to be generated (step S2).

Next, the EUV controller 51 may move the position of a point of focus by the laser beam focusing optical system 22a to the targeted position (Xt, Yt, Zt) where the EUV light is to be generated (step S3). The position of the point of focus by the laser beam focusing optical system 22a may be moved by controlling the triaxial stage 84.

Next, the trajectory of the target may be adjusted to pass through the targeted position (Xt, Yt, Zt) where the EUV light is to be generated. For example, the EUV controller 51 may move the target supply device 26 so that the X coordinate value and Y coordinate value of the position of the opening 62 are coincident with the X coordinate value and Y coordinate value of the targeted position (Xt, Yt, Zt) where the EUV light is to be generated (step S4). The EUV controller 51 may move the target supply device 26 by controlling the dual-axis stage 63.

Next, the EUV controller 51 may calculate a time period tz between a point in time at which the target was detected and a point in time at which the target reaches a Z direction targeted position Zt where the EUV light is to be generated (step S5). The time period tz may be calculated through the following formula using the Z direction detection position Zs, the Z direction targeted position Zt, and the target velocity v.

$$tz=(Zt-Zs)/v$$

It should be noted that the Z direction detection position Zs may be the Z direction position of the target at the timing when the aforementioned detection signal Vc changes from the first potential $V_L$ to the second potential $V_H$.

Next, the EUV controller 51 may calculate the difference Δt between the aforementioned time period tz and a time period between the point in time at which the target was detected and a point in time at which the target reaches the Z direction reference position Z0 (step S6). The difference Δt may be calculated through the following formula using the aforementioned time period tz, the Z direction detection position Zs, the Z direction reference position Z0, and the target velocity v.

$$\Delta t=tz-(Z0-Zs)/v$$

Next, the EUV controller 51 may set a delay time td and send this delay time td to the delay circuit 53 (step S7). The delay time td may be set to a value obtained by adding the aforementioned difference Δt to the reference delay time td0 as described below:

$$td=td0+\Delta t$$

Next, the EUV controller 51 may control the target supply device 26 so that the target is outputted into the chamber 2 (step S8). For example, the EUV controller 51 may output, to the target supply device 26, a target supply start signal for instructing the target supply device 26 to start to supply a target. Alternatively, the EUV controller 51 may output, to the target supply device 26, a trigger signal for outputting each individual target 27.

Next, the EUV controller 51 may output, to the delay circuit 53, the target detection signal outputted from the target sensor 40 (step S9). Through this, the delay circuit 53 can output, to the laser apparatus 3, a timing signal obtained by imparting the delay time td to the target detection signal. The laser apparatus 3 can generate a pulse laser beam in accordance with this timing signal, and the target can be irradiated with this pulse laser beam.

Next, the EUV controller 51 may determine whether or not to change the targeted position (Xt, Yt, Zt) where the EUV light is to be generated (step S10). In the case where the exposure apparatus 6 has outputted a new targeted position where the EUV light is to be generated, the EUV controller 51 may determine to change the targeted position where the EUV light is to be generated (step S10: YES). In the case where the EUV controller 51 has determined to change the targeted position where the EUV light is to be generated, the process may return to the aforementioned step S2. In the case where the EUV controller 51 has determined not to change the targeted position where the EUV light is to be generated (step S10: NO), the process may proceed to step S11.

In step S11, the EUV controller 51 may determine whether or not to discontinue the generation of the EUV light. Upon receiving, from the exposure apparatus 6, a control signal for discontinuing the generation of the EUV light, the EUV controller 51 may determine to discontinue the generation of the EUV light (step S11: YES). In the case where the EUV controller 51 has determined to discontinue the generation of the EUV light, the process of this flowchart may be terminated. In the case where the EUV controller 51 has determined not to discontinue the generation of the EUV light (step S11: NO), the process may return to the aforementioned step S8.

4.4 First Modification (Transfer to Slit)

Figure 5A:
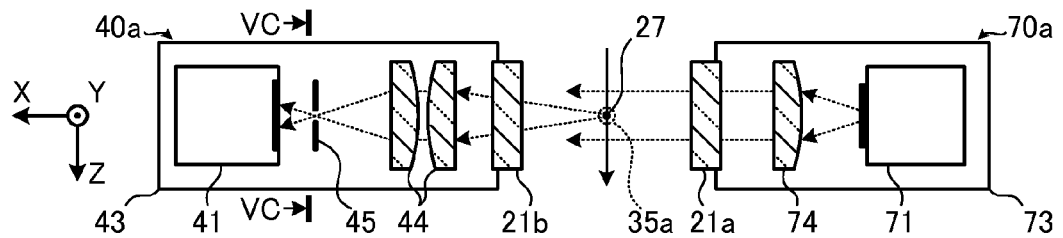
FIG. 5A is an enlarged partial cross-sectional view illustrating a target sensor and a light-emitting unit in a first modification of the first embodiment.
Figure 5B:
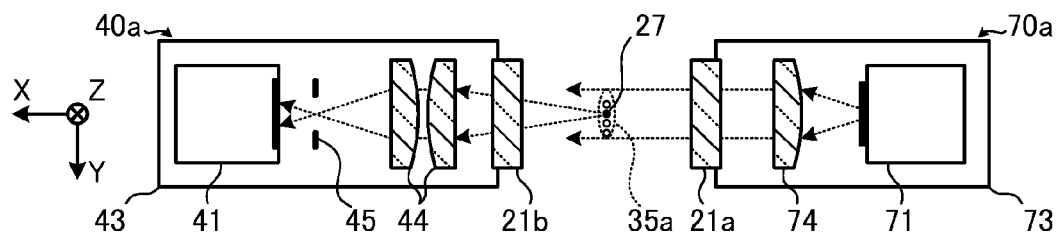
FIG. 5B is a partial cross-sectional view of the target sensor and the light-emitting unit illustrated in FIG. 5A, as viewed from an upstream side in a direction of movement of a target.
Figure 5C:
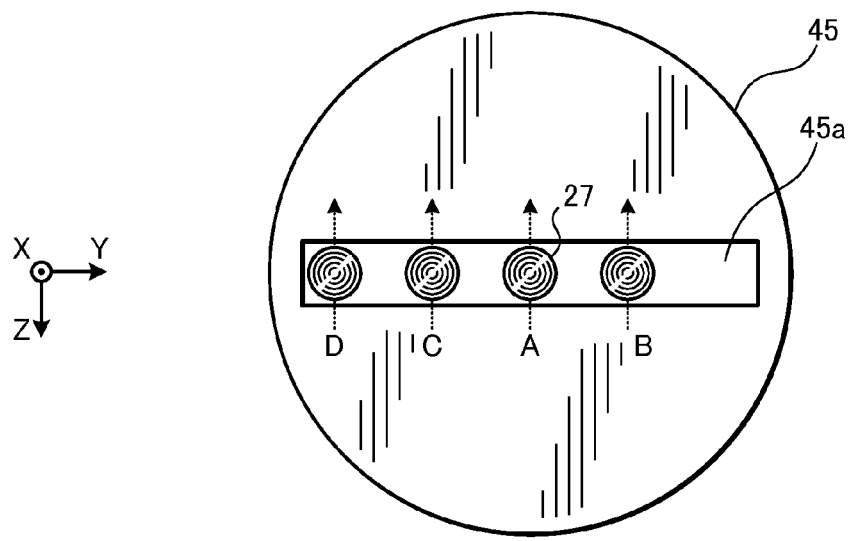
FIG. 5C illustrates a cross-section taken along a line VC-VC perpendicular to a travelling direction of light passing through a slit plate illustrated in FIG. 5A, together with the slit plate.
Figure 5D:
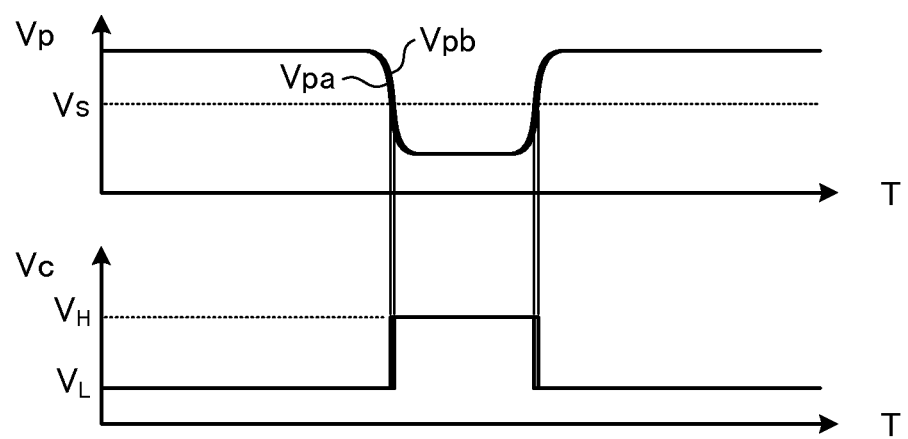
FIG. 5D is a waveform chart of signals in the respective parts of a circuit of an optical sensor illustrated in FIG. 5A.

FIG. 5A is an enlarged partial cross-sectional view illustrating a target sensor and a light-emitting unit in a first modification of the first embodiment. FIG. 5B is a partial cross-sectional view of the target sensor and the light-emitting unit illustrated in FIG. 5A, as viewed from an upstream side in a direction of movement of a target. FIG. 5C illustrates a cross-section taken along a line VC-VC perpendicular to the travelling direction of light passing through a slit plate illustrated in FIG. 5A, together with the slit plate. FIG. 5D is a waveform chart of signals in the respective parts of a circuit of an optical sensor illustrated in FIG. 5A. A circuit configuration of an optical sensor 41 may be the same as that shown in FIG. 3D.

A light-emitting unit 70a may include a light source 71, a collimator 74, and a plate 73. Light outputted by the light source 71 may be guided by the collimator 74 to a predetermined position on a trajectory of a target 27 and the periphery thereof through a window 21a.

A target sensor 40a may include an optical sensor 41, a transfer optical system 44, a slit plate 45, and a plate 43. The slit plate 45 may be disposed perpendicularly to the travelling direction of light from the predetermined position (the X direction). The slit plate 45 may have a slit 45a formed therein which is longer along the Y direction than along the Z direction.

The slit plate 45 can allow passage of light incident on the slit 45a and control passage of light incident on the periphery of the slit 45a. Light having passed through the slit 45a can be detected by the optical sensor 41.

The transfer optical system 44 may be configured such that an image of a shadow of a target 27 passing through the predetermined position on the trajectory of the target 27 or the periphery thereof is formed in the slit 45a or a position therearound. The image that is formed in the slit 45a or the position therearound by the transfer optical system 44 may be an inverted image of the target 27. Therefore, in the case where the target 27 moves in a downward direction (the Z direction) in FIG. 5A, the image of the target 27 can move in an upward direction (an −z direction). That is, the image of the target 27 can move from a lower position in FIG. 5C through the position within the slit 45a to an upper position in FIG. 5C. As shown in FIG. 5C, when the image of the target 27 has reached the position within the slit 45a, the light is blocked by the target 27, so that the amount of light that passes through the slit 45a can become smaller. At this point in time, the amount of light that is received by a light-receiving element of the optical sensor 41 can decrease. It should be noted that a region within the slit 45a is taken as a third predetermined region in the first modification.

In FIG. 5D, the horizontal axis represents time T, and the vertical axes of the upper and lower waveform charts represent an output signal Vp from the amplifier 41b and a detection signal Vc outputted from the comparator 41c, respectively. As shown in FIG. 5D, the output signal Vp, which is a signal obtained by amplifying the output from the light-receiving element of the optical sensor 41, can take on a lower potential when the image of the target 27 has reached the position within the slit 45a than when the image of the target 27 has not reached the position within the slit 45a. When the image of the target 27 has passed through the position within the slit 45a, the output signal Vp can return to its original potential. The reference potential Vs may be set between a potential of the output signal Vp at the time when the image of the target 27 has not reached the position within the slit 45a and a potential of the output signal Vp at the time when the image of the target 27 has reached the position within the slit 45a.

The detection signal Vc that is outputted from the comparator 41c (FIG. 3D) can take on a first potential $V_L$ in a state where the output signal Vp takes on a potential that is higher than the reference potential Vs. When the output signal Vp takes on a potential that is lower than the reference potential Vs, the detection signal Vc can take on a second potential $V_H$. When the output signal Vp returns to its original high potential, the detection signal Vc can return to the first potential $V_L$.

In the case where an image of an object is formed by the transfer optical system 44, the position of the object relative to the position of the transfer optical system 44 and the position of the image can be in one-to-one correspondence to each other. In order for the image of the target 27 to be formed at a position within the slit 45a by the transfer optical system 44, it can be necessary that the target 27 be positioned within a predetermined region 35a. The region 35a where the target 27 should be positioned in order for the image of the target 27 to be formed at a position within the slit 45a is taken as a second predetermined region in the first modification. Since the slit 45a has a rectangular shape that is longer along the Y direction than along the Z direction, the region 35a can also have a shape that is longer along the Y direction than along the Z direction.

The slit 45a may be in the shape of a rectangle whose long-side direction is substantially coincident with the Y direction. Through this, a shift in the timing when the aforementioned detection signal Vc changes from the first potential $V_L$ to the second potential $V_H$ can be very small between the case where the image of the target 27 passes through substantially the center of the slit 45a (actual path A) and the case where the image of the target 27 passes through a position shifted in the Y direction (actual path B, actual path C, actual path D). In FIG. 5D, Vpa represents an output signal from the amplifier 41b in the case where the image of the target 27 passes through substantially the center of the slit 45a (actual path A), and Vpb represents an output signal from the amplifier 41b in the case where the image of the target 27 passes through a position shifted in the Y direction (actual path B, actual path C, actual path D).

In other respects, the same explanations may apply as those given with reference to FIGS. 2 to 4.

4.5 Second Modification (Detection of Reflected Light)

Figure 6A:
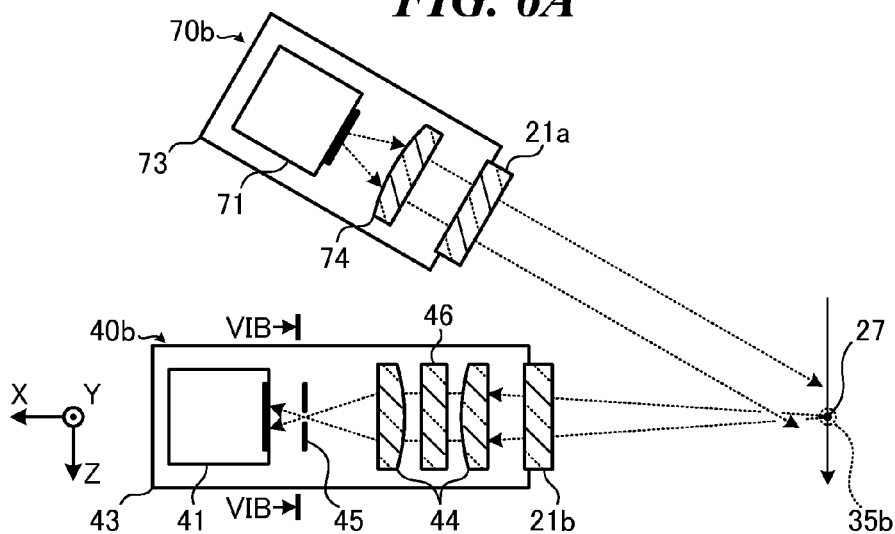
FIG. 6A is an enlarged partial cross-sectional view illustrating a target sensor and a light-emitting unit in a second modification of the first embodiment.
Figure 6B:
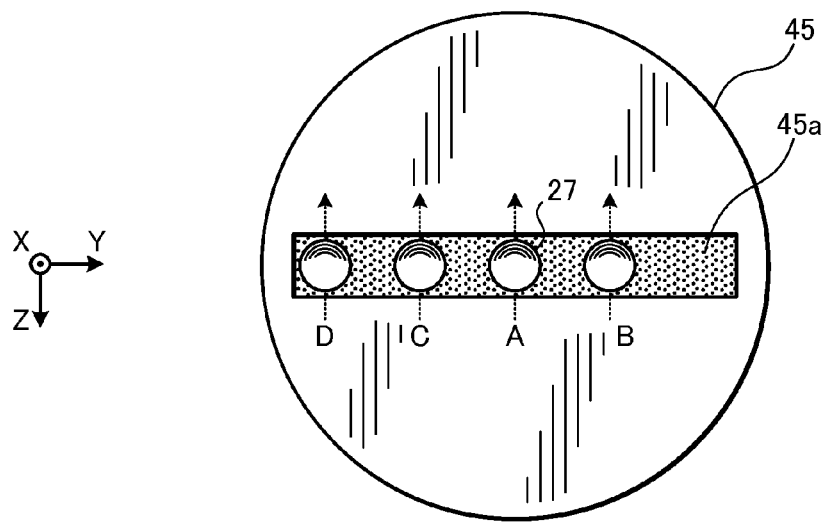
FIG. 6B illustrates a cross-section taken along a line VIB-VIB perpendicular to a travelling direction of light passing through a slit plate illustrated in FIG. 6A, together with the slit plate.
Figure 6C:
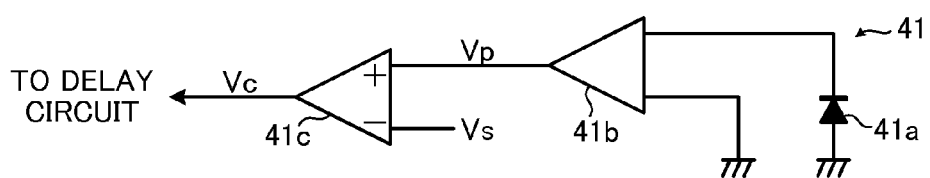
FIG. 6C is a circuit diagram of an optical sensor illustrated in FIG. 6A.
Figure 6D:
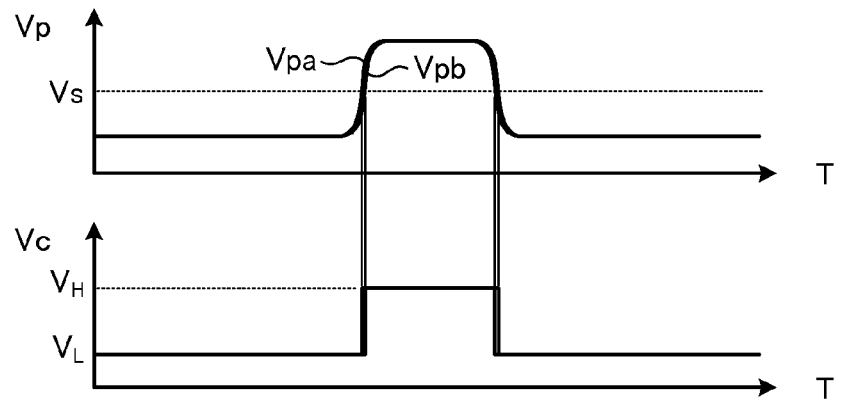
FIG. 6D is a waveform chart of signals in the respective parts of a circuit illustrated in FIG. 6C.

FIG. 6A is an enlarged partial cross-sectional view illustrating a target sensor and a light-emitting unit in a second modification of the first embodiment. FIG. 6B illustrates a cross-section taken along a line VIB-VIB perpendicular to the travelling direction of light passing through a slit plate illustrated in FIG. 6A, together with the slit plate. FIG. 6C is a circuit diagram of an optical sensor illustrated in FIG. 6A. FIG. 6D is a waveform chart of signals in the respective parts of a circuit illustrated in FIG. 6C.

A target sensor 40b and a light-emitting unit 70b may be disposed on one side (an K direction side) as viewed from a trajectory of a target 27 on an KZ plane. Specifically, the light-emitting unit 70b may be disposed at a position on the KZ plane that has a predetermined angle to the X direction as viewed from a predetermined position on the trajectory of the target 27. The light-emitting unit 70b may include a light source 71 and a collimator 74. Light outputted by the light source 71 may be guided by the collimator 74 to the predetermined position on the trajectory of the target 27 and the periphery thereof. The target sensor 40b may be disposed at a position in the K direction as viewed from the predetermined position on the trajectory of the target 27. The target sensor 40b may include a transfer optical system 44 and a slit plate 45. The transfer optical system 44 may form, in the slit 45a of the slit plate 45 or a position therearound, an image of a target 27 passing through the predetermined position or the periphery thereof.

That is, whereas the target sensor 40a in the aforementioned first modification detects light having passed through the periphery of the target 27, the target sensor 40b in the second modification may detect light reflected by the target 27. The target sensor 40b may further include an optical sensor 41 and a bandpass filter 46. By detecting light having traveled through the bandpass filter 46, the optical sensor 41 can detect light coming from the light-emitting unit 70b distinguishably from light coming from another light source.

As shown in FIG. 6C, a circuit configuration of the optical sensor 41 may be substantially the same as that shown in FIG. 3D. However, the two input terminals of the comparator 41c may be connected in an opposite manner to those shown in FIG. 3D. That is, the output terminal of the amplifier 41b may be connected to the positive input terminal of the comparator 41c, and the reference potential Vs may be applied to the negative input terminal of the comparator 41c.

In order for the image of the target 27 to be formed within the slit 45a (a third predetermined region) by the transfer optical system 44, it can be necessary that the target 27 be positioned within a predetermined region 35b. The region 35b where the target 27 should be positioned in order for the image of the target 27 to be formed within the slit 45a is taken as a second predetermined region in the second modification. The region 35b can have a shape that is longer along the Y direction than along the Z direction. When the target 27 has not reached the region 35b, light from the light-emitting unit 70b can be inhibited from being incident on the light-receiving element of the optical sensor 41. When the target 27 reaches the region 35b, an image of an irradiated surface of the target 27 that has been irradiated with the light from the light-emitting unit 70b can be formed at the position within the slit 45a. In this way, a portion of the light reflected by the target 27 can reach the light-receiving element through the slit 45a.

In FIG. 6D, the horizontal axis represents time T, and the vertical axes of the two waveform charts represent an output signal Vp from the amplifier 41b and a detection signal Vc that is outputted from the comparator 41c, respectively. As shown in FIG. 6D, the output signal Vp, which is a signal obtained by amplifying the output from the light-receiving element of the optical sensor 41, can take on a higher potential when the target 27 has reached the region 35b than when the target 27 has not reached the region 35b. When the target 27 has passed through the region 35b, the output signal Vp can return to its original potential. The reference potential Vs may be set between a potential of the output signal Vp at the time when the target 27 has not reached the region 35b and a potential of the output signal Vp at the time when the target 27 has reached the region 35b. In FIG. 6D, Vpa represents an output signal from the amplifier 41b in the case where the image of the target 27 passes through substantially the center of the slit 45a (actual path A), and Vpb represents an output signal from the amplifier 41b in the case where the image of the target 27 passes through a position shifted in the Y direction (actual path B, actual path C, actual path D).

The detection signal Vc that is outputted from the comparator 41c can take on a first potential $V_L$ in a state where the output signal Vp takes on a potential that is lower than the reference potential Vs. When the output signal Vp takes on a potential that is higher than the reference potential Vs, the detection signal Vc can take on a second potential $V_H$. When the output signal Vp returns to its original low potential, the detection signal Vc can return to the first potential $V_L$.

In other respects, the second modification may be the same as the first modification described with reference to FIGS. 5A to 5D.

4.6 Third Modification (Light-Emitting Unit Using Beam Expander)

Figure 7A:
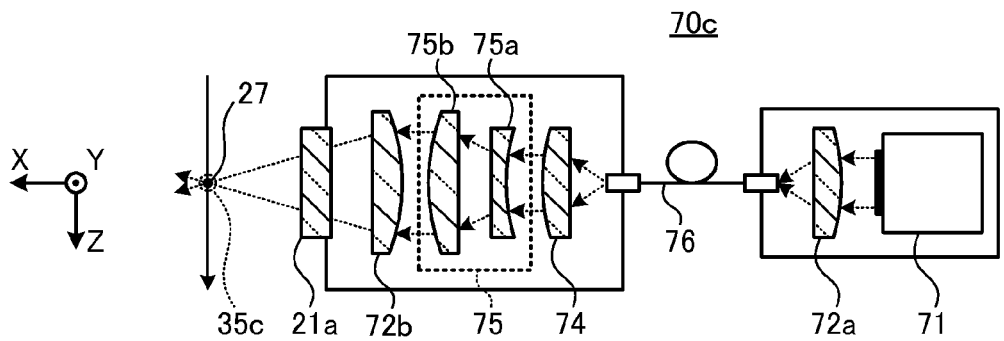
FIG. 7A is an enlarged partial cross-sectional view illustrating a light-emitting unit in a third modification of the first embodiment.
Figure 7B:
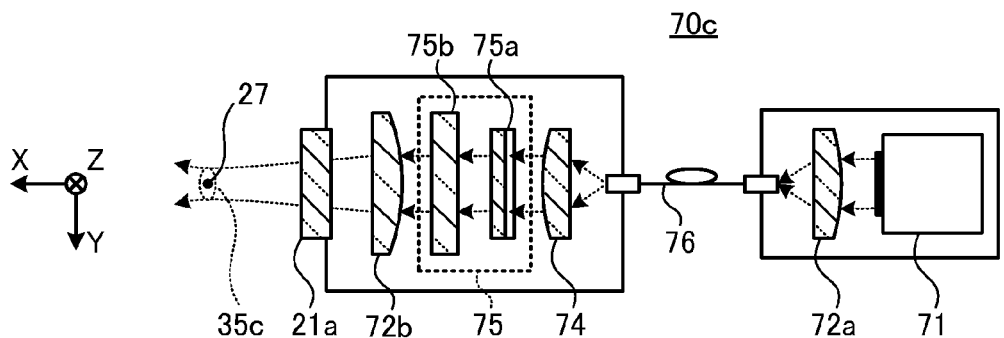
FIG. 7B is a partial cross-sectional view of the light-emitting unit illustrated in FIG. 7A, as viewed from an upstream side in a direction of movement of a target.

FIG. 7A is an enlarged partial cross-sectional view illustrating a light-emitting unit in a third modification of the first embodiment. FIG. 7B is a partial cross-sectional view of the light-emitting unit illustrated in FIG. 7A, as viewed from an upstream side in a direction of movement of a target. FIGS. 7A and 7B omit to illustrate a target sensor. The target sensor may be disposed on the opposite side to a light-emitting unit 70c with a trajectory of a target 27 therebetween, and may receive light having passed through the periphery of the target 27. Alternatively, the target sensor may be disposed on the same side as the light-emitting unit 70c as viewed from the trajectory of the target 27, and may receive light reflected by the target 27.

The light-emitting unit 70c may include a first unit and a second unit. The first unit may include a light source 71 and a focusing optical system 72a. The second unit may include a collimator 74, a unidirectional beam expander 75, and a focusing optical system 72b. The first unit and the second unit may be connected to each other via an optical fiber 76.

The light source 71 may be a semiconductor laser. The focusing optical system 72a may cause light generated by the light source 71 to be focused on an input port at one end of the optical fiber 76. The optical fiber 76 may cause the light focused on the input port of the optical fiber 76 to be emitted from an output port at the other end of the optical fiber 76. The collimator 74 may convert the light emitted from the output port of the optical fiber 76 into parallel light whose optical path has a substantially circular transverse section.

The unidirectional beam expander 75 may include a cylindrical concave lens 75a and a cylindrical convex lens 75b. The cylindrical concave lens 75a may be disposed so that the curvature of its concave surface in the Z direction takes on a predetermined value that is greater than 0 and the curvature of the concave surface in the Y direction is substantially 0. The cylindrical convex lens 75b may be disposed so that the curvature of its convex surface in the Z direction takes on a predetermined value that is greater than 0 and the curvature of the convex surface in the Y direction is substantially 0. This enables the unidirectional beam expander 75 to convert the light from the collimator 74 into elliptical light whose optical path has a transverse section that is longer along the Z direction than along the Y direction. It should be noted that the unidirectional beam expander 75 is not limited to one using a cylindrical lens, but may be one using a prism.

The focusing optical system 72b may cause the light outputted from the unidirectional beam expander 75 to be focused at a predetermined position on the trajectory of the target 27. The minimum spot diameter of a laser beam focused by a focusing optical system can be inversely proportional to the diameter of a beam incident on the focusing optical system. Through this, the transverse section of the optical path in a region 35c where the light is focused by the focusing optical system 72b may be in the shape of an ellipse that is longer along the Y direction than along the Z direction. Therefore, even if the actual path of the target 27 is shifted in the Y direction with respect to the trajectory of the target 27, a shift in the timing when the target 27 is irradiated with light can be better suppressed than in the case where the length of the transverse section of the optical path along the Z direction and the length of the transverse section of the optical path along the Y direction are equal. Through this, a shift in the timing of detection by the target sensor can be suppressed. It should be noted that the region 35c where the light is focused by the focusing optical system 72b is taken as a second predetermined region in the third modification.

In other respects, the same explanations may apply as those given with reference to FIGS. 2 to 4.

4.7 Fourth Modification (Light-Emitting Unit Using Slit)

Figure 8A:
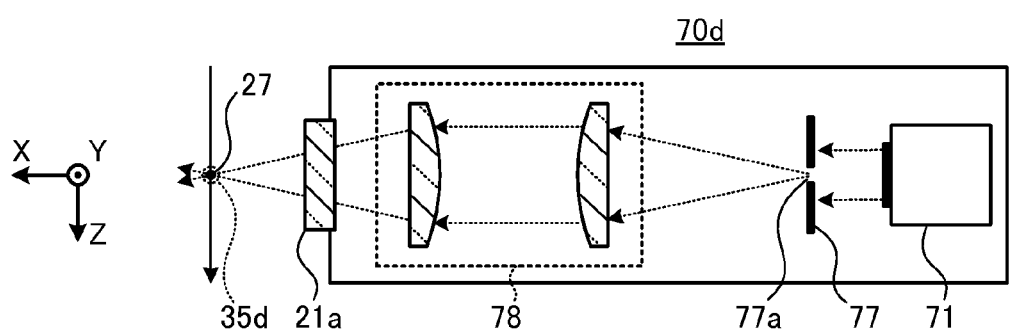
FIG. 8A is an enlarged partial cross-sectional view illustrating a light-emitting unit in a fourth modification of the first embodiment.
Figure 8B:
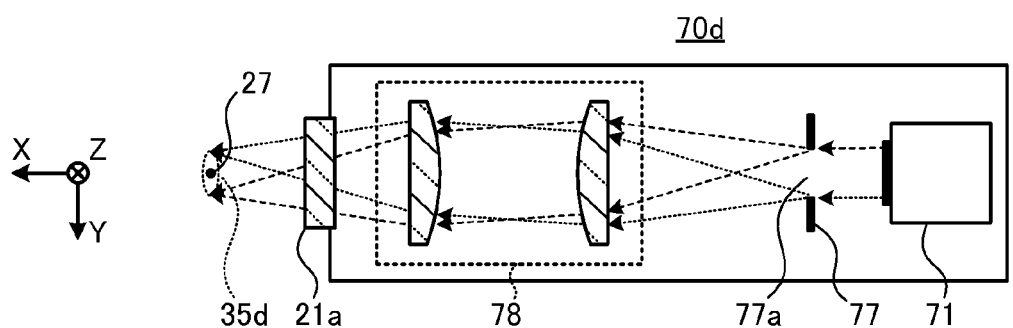
FIG. 8B is a partial cross-sectional view of the light-emitting unit illustrated in FIG. 8A, as viewed from an upstream side in a direction of movement of a target.

FIG. 8A is an enlarged partial cross-sectional view illustrating a light-emitting unit in a fourth modification of the first embodiment. FIG. 8B is a partial cross-sectional view of the light-emitting unit illustrated in FIG. 8A, as viewed from an upstream side in a direction of movement of a target. FIGS. 8A and 8B omit to illustrate a target sensor. The target sensor may be disposed on the opposite side to a light-emitting unit 70d with a trajectory of a target 27 therebetween, and may receive light having passed through the periphery of the target 27. Alternatively, the target sensor may be disposed on the same side as the light-emitting unit 70d as viewed from the trajectory of the target 27, and may receive light reflected by the target 27.

In the fourth modification, the light-emitting unit 70d may include a light source 71, a slit plate 77, and a transfer optical system 78. The slit plate 77 may have a slit 77a formed therein which is longer along the Y direction than along the Z direction. The slit 77a may be in the shape of a rectangle whose long-side direction is substantially coincident with the Y direction. The transfer optical system 78 may form an image of the slit 77a in a region 35d including part of the trajectory of the target 27. The region 35d where the image of the slit 77a is formed by the transfer optical system 78 can be a region that is longer along the Y direction than along the Z direction. Since the slit 77a has a rectangular shape, the region 35d where the image of the slit 77a is formed can be a rectangular region when viewed in the X direction (not illustrated). Therefore, even if the actual path of the target 27 is shifted in the Y direction with respect to the trajectory of the target 27, a shift in the timing when the target 27 is irradiated with light can be better suppressed than in the case where the length of the region 35d along the Z direction and the length of the region 35d along the Y direction are equal. Through this, a shift in the timing of detection by the target sensor can be suppressed. It should be noted that the region 35d where the image of the slit 77a is formed is taken as a second predetermined region in the fourth modification.

In other respects, the same explanations may apply as those given with reference to FIGS. 2 to 4.

4.8 Fifth Modification (Target Sensor Using Light Position Sensitive Detector)

Figure 9A:
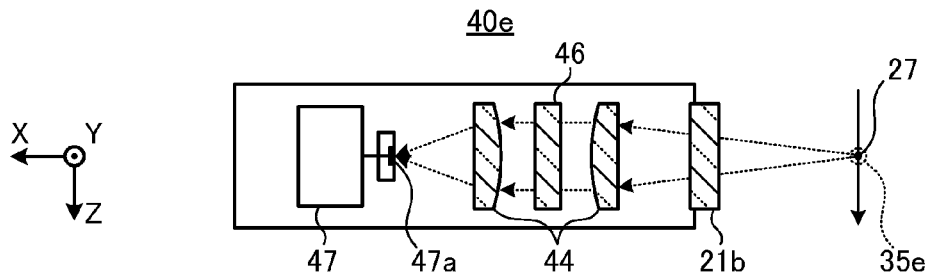
FIG. 9A is an enlarged partial cross-sectional view illustrating a target sensor in a fifth modification of the first embodiment.
Figure 9B:
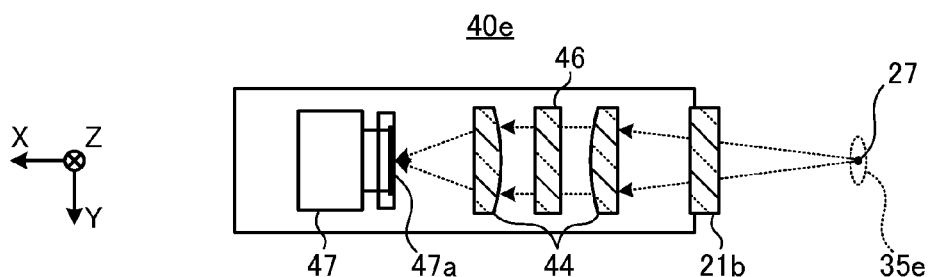
FIG. 9B is a partial cross-sectional view of the target sensor illustrated in FIG. 9A, as viewed from an upstream side in a direction of movement of a target.
Figure 9C:
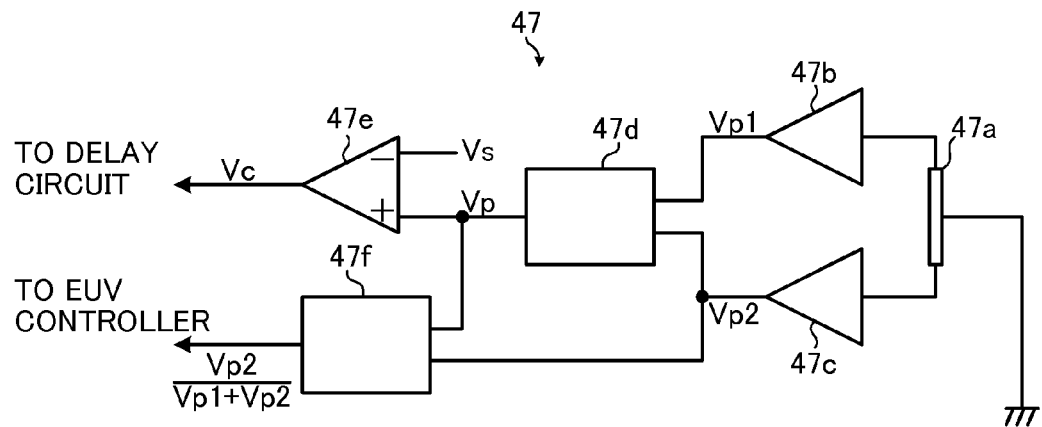
FIG. 9C is a circuit diagram of an optical sensor illustrated in FIG. 9A.

FIG. 9A is an enlarged partial cross-sectional view illustrating a target sensor in a fifth modification of the first embodiment. FIG. 9B is a partial cross-sectional view of the target sensor illustrated in FIG. 9A, as viewed from an upstream side in a direction of movement of a target. FIG. 9C is a circuit diagram of an optical sensor illustrated in FIG. 9A. FIGS. 9A and 9B omit to illustrate a light-emitting unit. A target sensor 40e in the fifth modification may be disposed on the same side as the light-emitting unit as viewed from the trajectory of the target 27, and may receive light reflected by the target 27.

In the fifth modification, the target sensor 40e may include a transfer optical system 44, a bandpass filter 46, and an optical sensor 47. The transfer optical system 44 may form, on the optical sensor 47 or a position therearound, an image of a reflecting surface of the target 27 irradiated with light by the light-emitting unit.

The optical sensor 47 may include a light-receiving unit 47a, first and second amplifiers 47b and 47c, an adder circuit 47d, a comparator 47e, and a divider circuit 47f. The light-receiving unit 47a may be a one-dimensional light position sensitive detector (PSD). As shown in FIGS. 9A and 9B, the light-receiving unit 47a may have a shape that is longer along the Y direction than along the Z direction. A region where the light-receiving unit 47a receives light may be a region that is longer along the Y direction than along the Z direction. It should be noted that the region where the light-receiving unit 47a receives light is taken as a third predetermined region in the fifth modification.

In order for the image of the target 27 to be formed at a position on the light-receiving unit 47a by the transfer optical system 44, it can be necessary that the target 27 be positioned within a predetermined region 35e. The region 35e where the target 27 should be positioned in order for the image of the target 27 to be formed at a position on the light-receiving unit 47a is taken as a second predetermined region in the fifth modification. The region 35e can have a shape that is longer along the Y direction than along the Z direction. When the target 27 is positioned in the region 35e, the image of the target 27 can be formed at a position on the light-receiving unit 47a. Through this, the light-receiving unit 47a can detect the target 27 having reached the region 35e.

When the light-receiving unit 47a has received light at a portion thereof, the light-receiving unit 47a may output a different voltage signal depending on the position (Y direction position) at which the light was received. For example, when the light-receiving unit 47a has received light at a center position thereon, the light-receiving unit 47a may output substantially equal voltage signals through first and second terminals positioned at both ends of the light-receiving unit 47a. Alternatively, when the light-receiving unit 47a has received light at a position on the side of the first terminal thereof, the light-receiving unit 47a may output a stronger voltage signal through the first terminal than it does through the second terminal. On the contrary, when the light-receiving unit 47a has received light at a position on the side of the second terminal thereof, the light-receiving unit 47a may output a stronger voltage signal through the second terminal than it does through the first terminal.

The first terminal of the light-receiving unit 47a may be connected to the first amplifier 47b, and the second terminal of the light-receiving unit 47a may be connected to the second amplifier 47c. Respective output terminals of the first and second amplifiers 47b and 47c may be connected to the adder circuit 47d. The adder circuit 47d may add up an output Vp1 from the first amplifier 47b and an output Vp2 from the second amplifier 47c. Through this, the adder circuit 47d can output the output signal Vp according to the intensity of light received, regardless of whether the light-receiving unit 47a has received the light at a position on the side of the first terminal or on the side of the second terminal. An output terminal of the adder circuit 47d may be connected to the comparator 47e. The comparator 47e can output the detection signal Vc by comparing the output signal Vp to the reference potential Vs.

Further, the output terminal of the second amplifier 47c and the output terminal of the adder circuit 47d may be connected to the divider circuit 47f. By dividing the output Vp2 from the second amplifier 47c by the output Vp from the adder circuit 47d, the divider circuit 47f can calculate a Y direction position at which the light-receiving unit 47a has received light. The Y direction position thus calculated is transmitted to the EUV controller 51 as data indicating a Y direction shift of the actual path of the target 27, and can be utilized for the EUV controller 51 to control the dual-axis stage 63.

The transfer optical system 44 of the target sensor 40e may be an optical system that is telecentric on the side of the trajectory of the target 27. In the case where the transfer optical system 44 is telecentric on the side of the trajectory of the target 27, the target sensor 40e can accurately detect the Y direction position of the actual path of the target 27 even if the actual path of the target 27 shifts in the X direction with respect to the trajectory of the target 27. Alternatively, the transfer optical system 44 may be an optical system that is telecentric on both sides (i.e. the side of the trajectory of the target 27 and the side of the image).

In other respects, the fifth modification may be the same as the second modification described with reference to FIGS. 6A to 6D.

The fifth modification has been described by taking, as an example, a case where the target sensor 40e is disposed on the same side as the light-emitting unit as viewed from the trajectory of the target 27 and receives light reflected by the target 27. However, the present disclosure is not limited to this example. As in the first modification described with reference to FIGS. 5A to 5D, the target sensor 40e may be disposed on the opposite side to the light-emitting unit with the trajectory of the target 27 therebetween, and may receive light having passed through the periphery of the target 27.

4.9 Sixth Modification (Adjustment of Reference Potential)

Figure 10A:
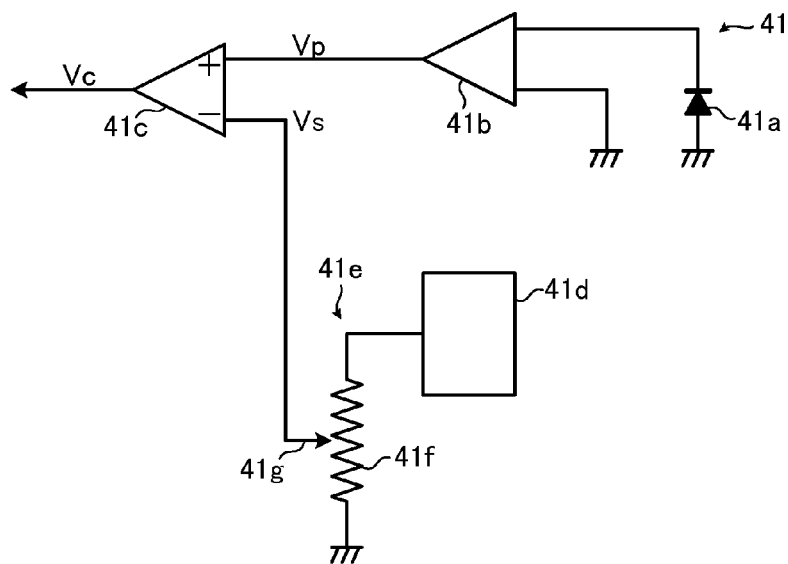
FIG. 10A is a circuit diagram of an optical sensor in a sixth modification of the first embodiment.
Figure 10B:
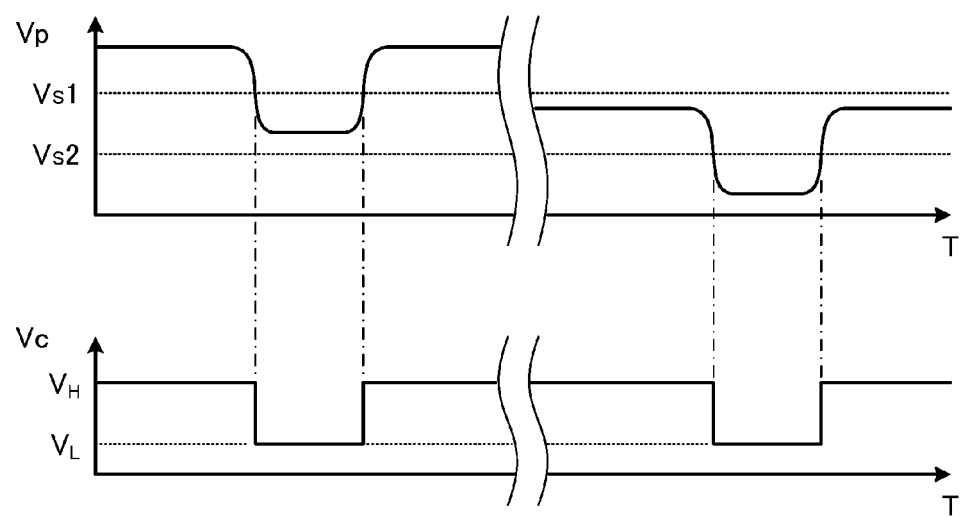
FIG. 10B is a waveform chart of signals in the respective parts of a circuit illustrated in FIG. 10A.

FIG. 10A is a circuit diagram of an optical sensor in a sixth modification of the first embodiment. FIG. 10B is a waveform chart of signals in the respective parts of a circuit illustrated in FIG. 10A.

As shown in FIG. 10A, the optical sensor 41 may include a reference power source 41d and a voltage divider 41e in addition to the light-receiving element 41a, the amplifier 41b, and the comparator 41c. The reference power source 41d may be a voltage source whose output voltage is at a certain value. The voltage divider 41e may include an electrical resistor 41f connected between the reference power source 41d and a ground potential and a moving electrode 41g that is movable along the electrical resistor 41f. The moving electrode 41g may be connected to an input terminal of the comparator 41c. The reference potential Vs that is inputted to the input terminal of the comparator 41c may be variable according to the position of the moving electrode 41g moving along the electrical resistor 41f. The voltage divider 41e may be constituted by a volume controller.

In FIG. 10B, the horizontal axis represents time T, and the vertical axes of the upper and lower waveform charts represent an output signal Vp from the amplifier 41b and a detection signal Vc that is outputted from the comparator 41c, respectively. It should be noted that in FIG. 10A, the positive and negative input terminals of the comparator 41c, to which the output signal Vp and the reference potential Vs are inputted, are in the opposite positions to those shown in FIG. 3D. For this reason, in FIG. 10B, the magnitude relationship of potential in the detection signal Vc is the opposite to that shown in FIG. 3E.

The output signal Vp from the amplifier 41b depends on the amount of light incident on the light-receiving element 41a. If debris of the target material dirties the windows 21a and 21b, the amount of light incident on the light-receiving element 41a may decrease, with the result that the output signal Vp may become weaker. That is, even if the output signal Vp has a totally high value at one time as shown on the left side of FIG. 10B, the output signal Vp can have a totally low value at another time as shown on the right side of FIG. 10B. Then, even if Vs1 can be used as the value of the reference potential Vs on the left side of FIG. 10B, use of Vs1 as the value of the reference potential Vs on the right side of FIG. 10B can make it impossible to detect passage of the target 27.

Therefore, the sixth modification allows a user to adjust the voltage divider 41e to change the reference potential Vs so that it can be set to Vs2. This makes it possible to detect passage of the target 27 even in the case where the windows 21a and 21b get dirty and the output signal Vp becomes weaker.

4.10 Seventh Modification (Automatic Adjustment of Reference Potential)

Figure 11A:
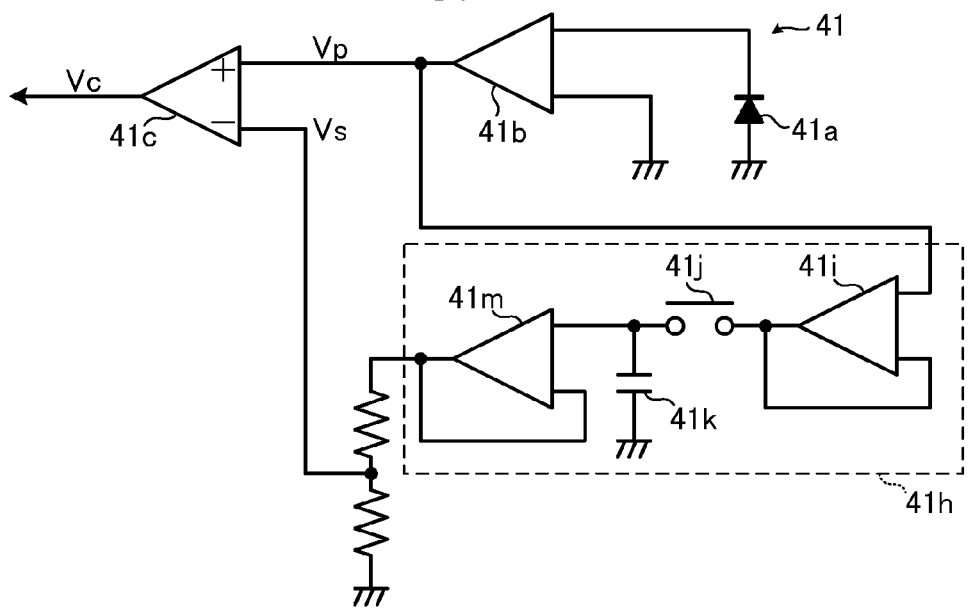
FIG. 11A is a circuit diagram of an optical sensor in a seventh modification of the first embodiment.
Figure 11B:
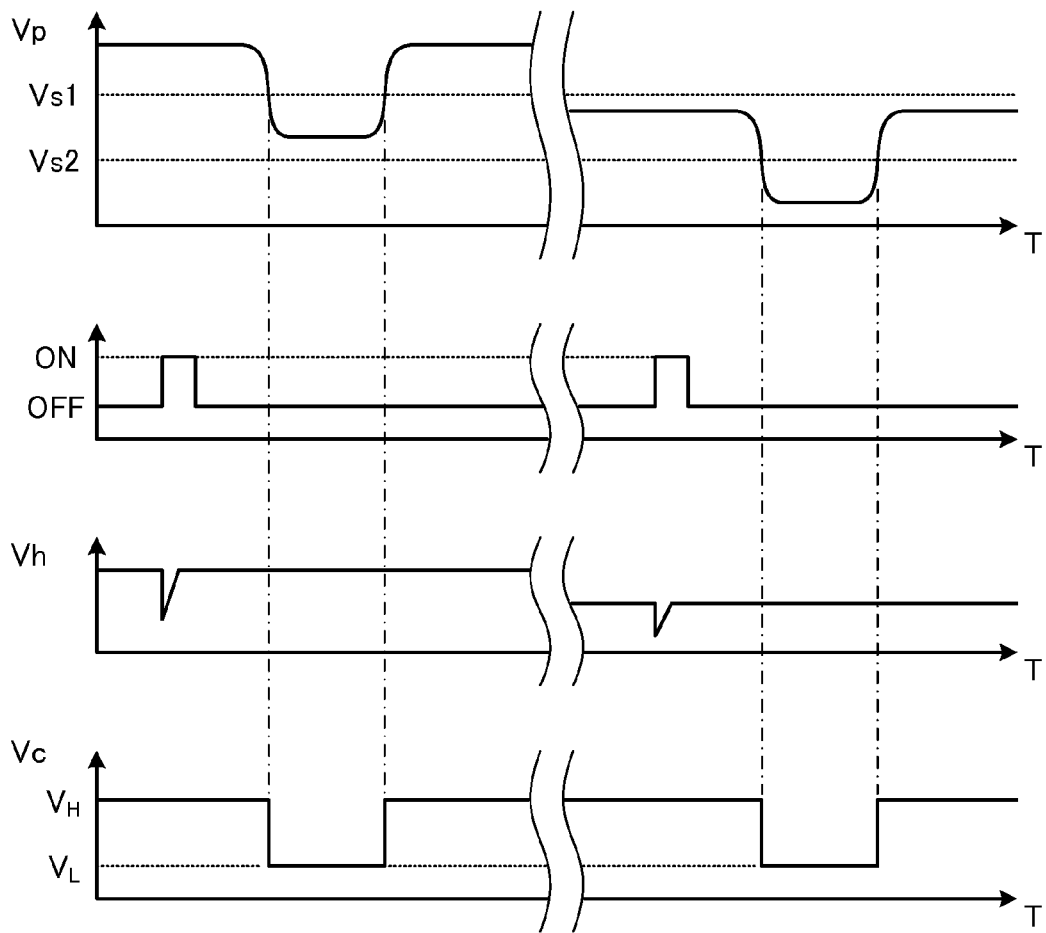
FIG. 11B is a waveform chart of signals in the respective parts of a circuit illustrated in FIG. 11A.

FIG. 11A is a circuit diagram of an optical sensor in a seventh modification of the first embodiment. FIG. 11B is a waveform chart of signals in the respective parts of a circuit illustrated in FIG. 11A.

As shown in FIG. 11A, the optical sensor 41 may include a sample hold circuit 41h in addition to the light-receiving element 41a, the amplifier 41b, and the comparator 41c. The sample hold circuit 41h may include a first voltage follower circuit 41i, an analog switch 41j, a hold capacitor 41k, and a second voltage follower circuit 41m. The first voltage follower circuit 41i may include a first operational amplifier, and the second voltage follower circuit 41m may include a second operational amplifier.

An output of the amplifier 11b may be connected to an input terminal of the first voltage follower circuit 41i, as well as the positive input terminal of the comparator 41c. An output terminal of the first voltage follower circuit 41i may be connected to a first terminal of the analog switch 41j. A second terminal of the analog switch 41j may be connected to a first terminal of the hold capacitor 41k and an input terminal of the second voltage follower circuit 41m. A second terminal of the hold capacitor 41k may be grounded. An output terminal of the second voltage follower circuit 41m may be connected to the negative input terminal of the comparator 41c through a voltage-dividing circuit.

In FIG. 11B, the horizontal axis represents time T. The vertical axis of the uppermost waveform chart represents the output signal Vp from the amplifier 41b, and the vertical axis of the second uppermost waveform chart represents whether the analog switch 41j is on or off. The vertical axis of the second lowermost waveform chart represents a charge voltage Vh of the hold capacitor 41k, and the vertical axis of the lowermost waveform chart represents a detection signal Vc that is outputted from the comparator 41c.

In other respects, the same as in FIGS. 10A and 10B applies.

In the seventh modification, charge corresponding to the output signal Vp from the amplifier 41b may be stored in the hold capacitor 41k, and the value of the reference potential Vs corresponding to the charge may be automatically set. Specifically, at the timing when no target 27 has been detected, the analog switch may be kept in an on state for a certain period of time first and may then be brought back into an off state. Through this, the charge corresponding to the value of the output signal Vp may be stored in the hold capacitor 41k through the first voltage follower circuit 41i.

As shown on the left side of FIG. 11B, the charge voltage Vh of the hold capacitor 41k may become high when the potential of the output signal Vp is high, and as shown on the right side of FIG. 11B, the charge voltage Vh of the hold capacitor 41k may become low when the potential of the output signal Vp is low. A potential corresponding to the charge voltage Vh of the hold capacitor 41k may be outputted through the second voltage follower circuit 41m and the voltage-dividing circuit and inputted as a reference potential Vs to the input terminal of the comparator 41c. When the potential of the output signal Vp is high, the reference potential may become Vs1, and when the potential of the output signal Vp is low, the reference potential may become Vs2. This makes it possible to detect passage of a target 27 even in a case where the windows 21a and 21b get dirty and the output signal Vp becomes weaker.

4.11 Eighth Modification (Automatic Adjustment of Reference Potential)

Figure 12A:
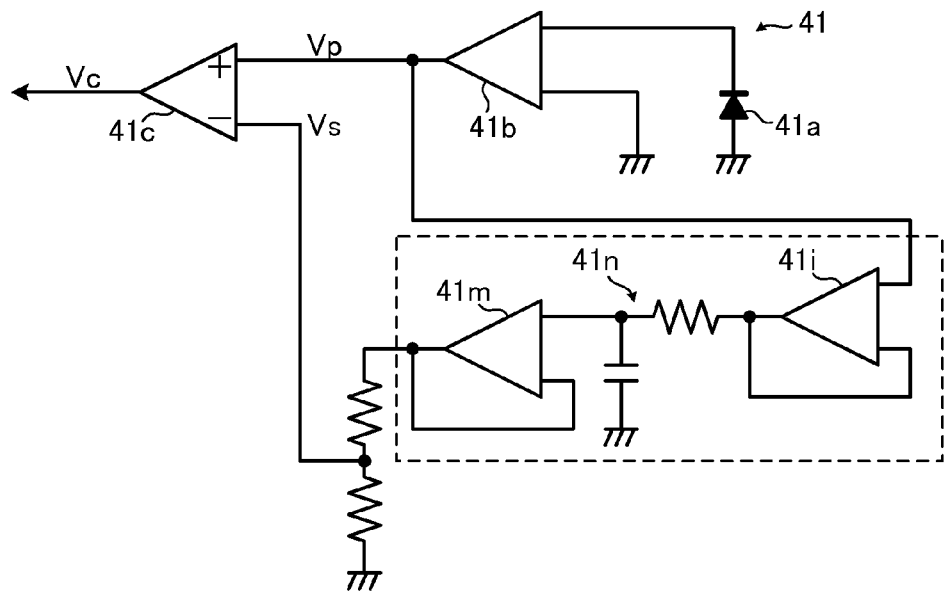
FIG. 12A is a circuit diagram of an optical sensor in an eighth modification of the first embodiment.
Figure 12B:
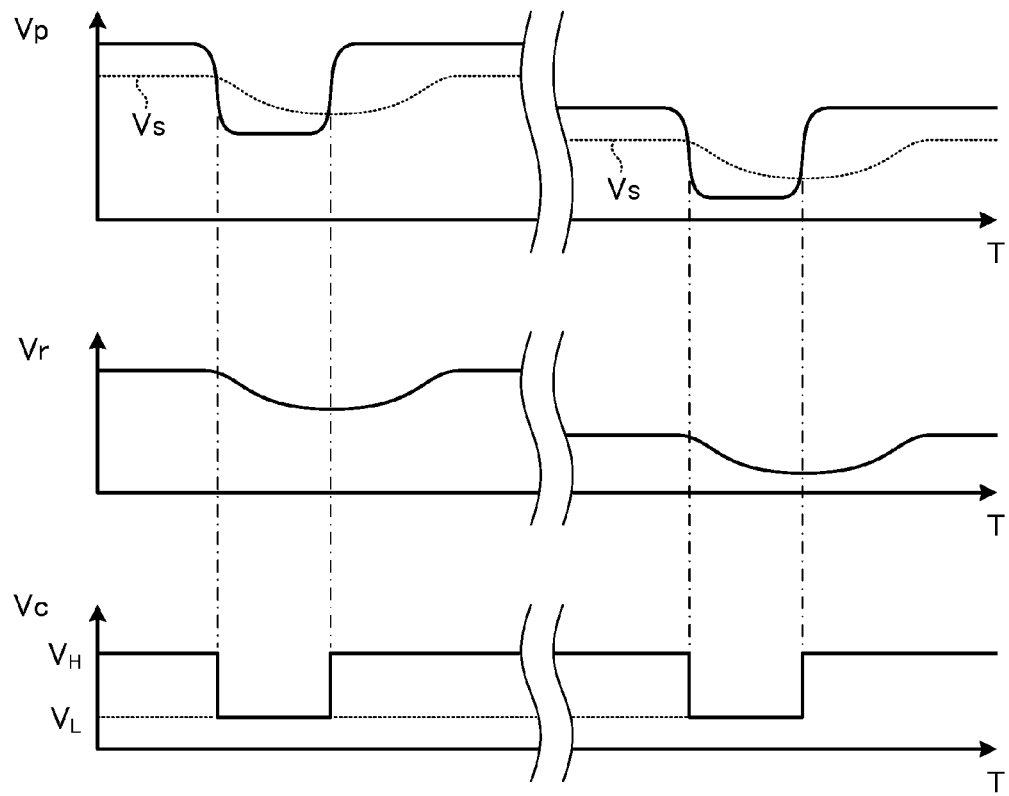
FIG. 12B is a waveform chart of signals in the respective parts of a circuit illustrated in FIG. 12A.

FIG. 12A is a circuit diagram of an optical sensor in an eighth modification of the first embodiment. FIG. 12B is a waveform chart of signals in the respective parts of a circuit illustrated in FIG. 12A.

As shown in FIG. 12A, the optical sensor 41 may include a first voltage follower circuit 41i, an RC circuit 41n, and a second voltage follower circuit 41m in addition to the light-receiving element 41a, the amplifier 41b, and the comparator 41c. The first voltage follower circuit 41i may include a first operational amplifier, and the second voltage follower circuit 41m may include a second operational amplifier.

An output of the amplifier 41b may be connected to an input terminal of the first voltage follower circuit 41i, as well as the positive input terminal of the comparator 41c. An output terminal of the first voltage follower circuit 41i may be connected to a first terminal of the RC circuit 41n. A second terminal of the RC circuit 41n may be connected to an input terminal of the second voltage follower circuit 41m. An output terminal of the second voltage follower circuit 41m may be connected to the negative input terminal of the comparator 41c through a voltage-dividing circuit.

In FIG. 12B, the horizontal axis represents time T, and the vertical axes of the upper, middle, and lower waveform charts represent an output signal Vp from the amplifier 41b, an output signal Vr from the second terminal of the RC circuit 41n, and a detection signal Vc that is outputted from the comparator 41c, respectively.

In other respects, the same as in FIGS. 10A and 10B applies.

As shown in FIG. 12B, the RC circuit 41n can output the output signal Vr in accordance with its time constant. The output signal Vr has rising and falling edges lagging behind rising and falling edges of the output signal Vp from the amplifier 41b. The level of potential of the output signal Vr from the RC circuit 41n can depend on the level of potential of the output signal Vp from the amplifier 41b.

As shown on the left side of FIG. 12B, the output signal Vr from the RC circuit 41n may become high when the potential of the output signal Vp is high, and as shown on the right side of FIG. 12B, the output signal Vr from the RC circuit 41n may become low when the potential of the output signal Vp is low. A potential corresponding to the potential of the output signal Vr from the RC circuit 41n may be outputted through the second voltage follower circuit 41m and the voltage-dividing circuit and inputted as a reference potential Vs to the input terminal of the comparator 41c. This makes it possible to detect passage of a target 27 even in a case where the windows 21a and 21b get dirty and the output signal Vp becomes weaker.

4.12 Ninth Modification (Automatic Adjustment of Reference Potential)

Figure 13A:
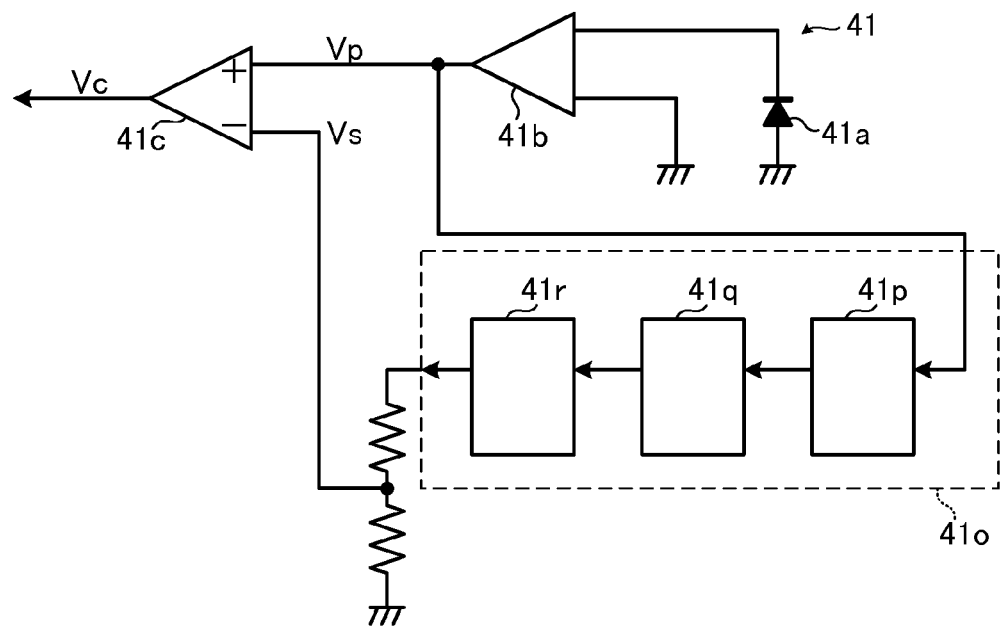
FIG. 13A is a circuit diagram of an optical sensor in a ninth modification of the first embodiment.
Figure 13B:
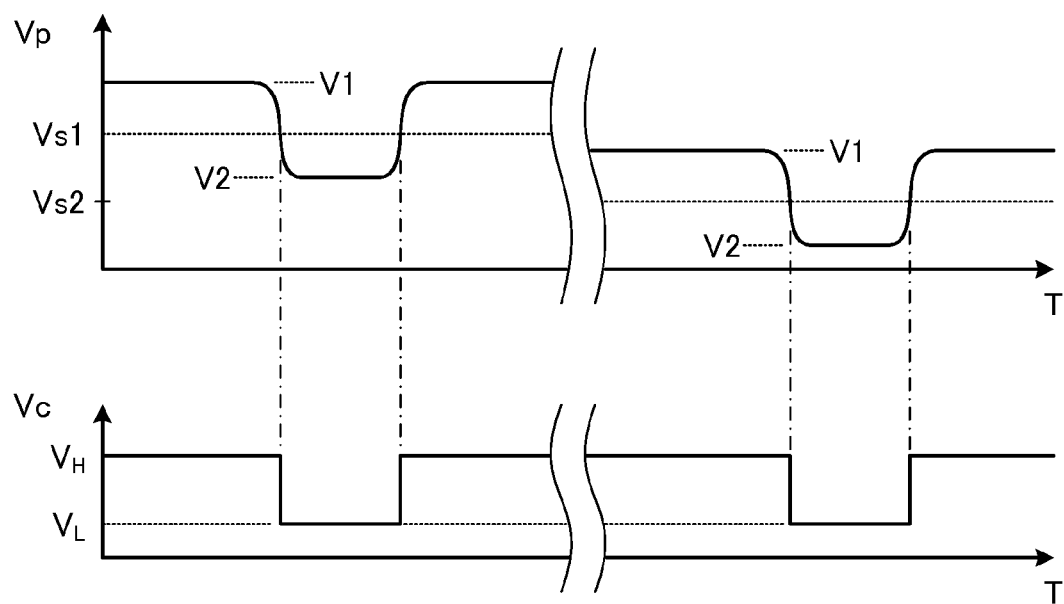
FIG. 13B is a waveform chart of signals in the respective parts of a circuit illustrated in FIG. 13A.

FIG. 13A is a circuit diagram of an optical sensor in a ninth modification of the first embodiment. FIG. 13B is a waveform chart of signals in the respective parts of a circuit illustrated in FIG. 13A.

As shown in FIG. 13A, the optical sensor 41 may include a reference potential controller 410 in addition to the light-receiving element 41a, the amplifier 41b, and the comparator 41c. The reference potential controller 410 may include an A/D converter 41p, a computing unit 41q, and a D/A converter 41r.

An output from the amplifier 41b may be inputted to the A/D converter 41p, as well as the positive input terminal of the comparator 41c. An output from the A/D converter 41p may be inputted to the computing unit 41q. An output from the computing unit 41q may be inputted to the D/A converter 41r. An output of the D/A converter 41r may be connected to the negative input terminal of the comparator 41c through a voltage-dividing circuit.

In FIG. 13B, the horizontal axis represents time T, and the vertical axes of the upper and lower waveform charts represent an output signal Vp from the amplifier 41b and a detection signal Vc that is outputted from the comparator 41c, respectively.

In other respects, the same as in FIGS. 10A and 10B applies.

The A/D converter 41p may convert the output signal Vp from the amplifier 41b into a digital signal. The computing unit 41q may calculate, from the digital signal into which the output signal Vp has been converted, a reference potential Vs depending on the output signal Vp. The D/A converter 41r may convert the reference potential Vs into an analog signal. This makes it possible to detect passage of a target 27 even in a case where the windows 21a and 21b get dirty and the output signal Vp becomes weaker.

Method to calculate the reference potential Vs by the computing unit 41q is not particularly limited. For example, the computing unit 41q may extract a voltage V1 at a base portion of the output signal Vp from the amplifier 41b and a voltage V2 at a peak portion of the output signal Vp. The computing unit 41q may calculate a voltage between the voltage V1 and the voltage V2, e.g. an intermediate value therebetween, as the reference potential Vs. Alternatively, the computing unit 41q may calculate, as the reference potential Vs, a value obtained by subtracting the value of a certain positive integer from the voltage V1 or a value obtained by adding the value of a certain positive integer to the voltage V2.

4.13 Tenth Modification (Adjustment of Light-Emitting Unit)

Figure 14:
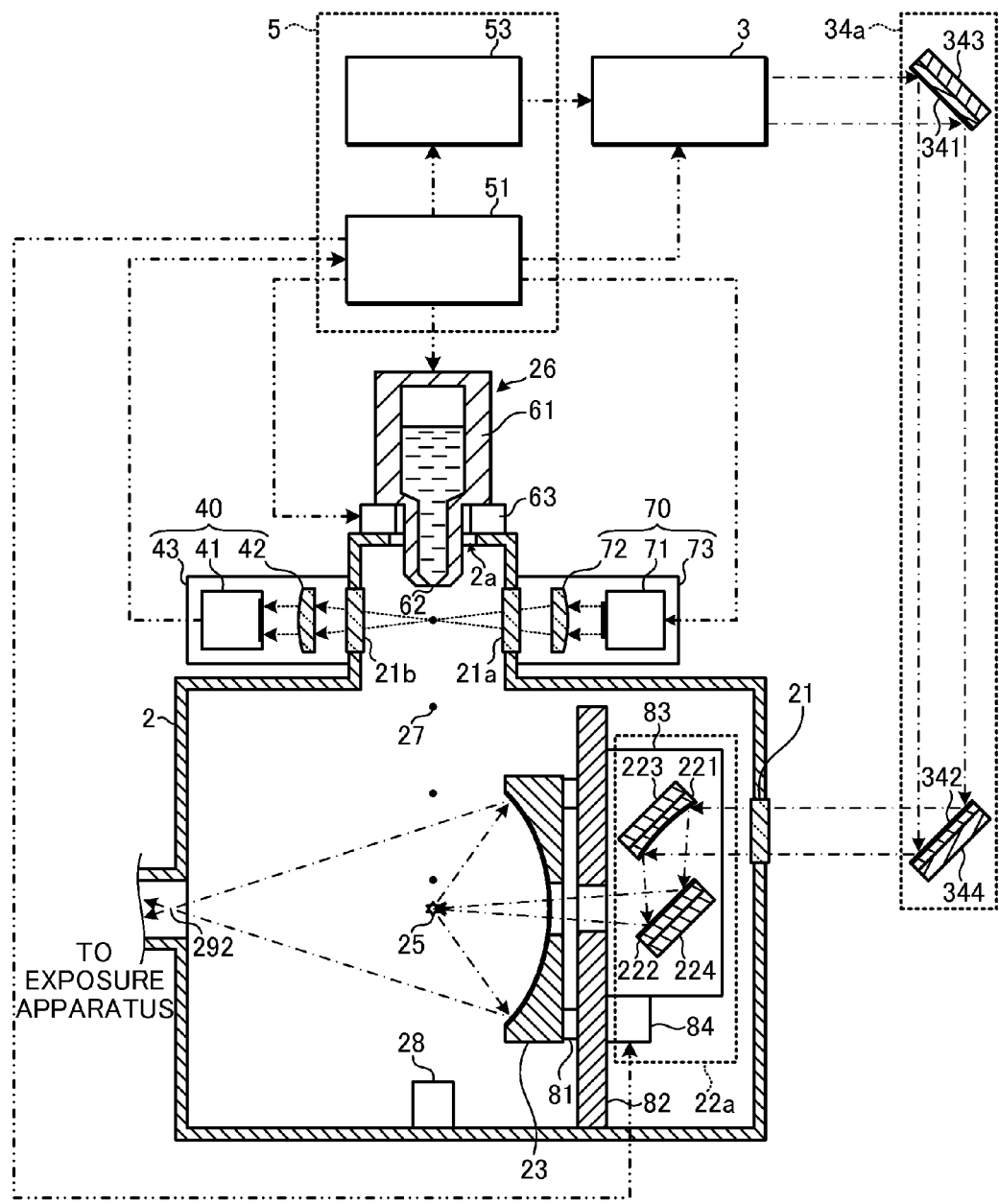
FIG. 14 is a partial cross-sectional view illustrating a configuration of an EUV light generation device according to a tenth modification of the first embodiment.

FIG. 14 is a partial cross-sectional view illustrating a configuration of an EUV light generation device according to a tenth modification of the first embodiment. The tenth modification is configured such that the output from the light source 71 can be controlled by the EUV controller 51. In other respects, the tenth modification is the same as the first embodiment described with reference to FIG. 2.

In the tenth modification, the optical sensor 41 may output the output signal Vp from the aforementioned amplifier 41b to the EUV controller 51. The EUV controller 51 may control the output from the light source 71 by monitoring the potential of the output signal Vp so that the output signal Vp falls within a predetermined range of potentials. The output from the light source 71 may be controlled, for example, by controlling an output voltage from a power source (not illustrated) that supplies power to the light source 71. This makes it possible to detect passage of a target 27 even in a case where the windows 21a and 21b get dirty.

5. Second Embodiment Target Sensor Using Laser Beam Focusing Optical System

Figure 15:
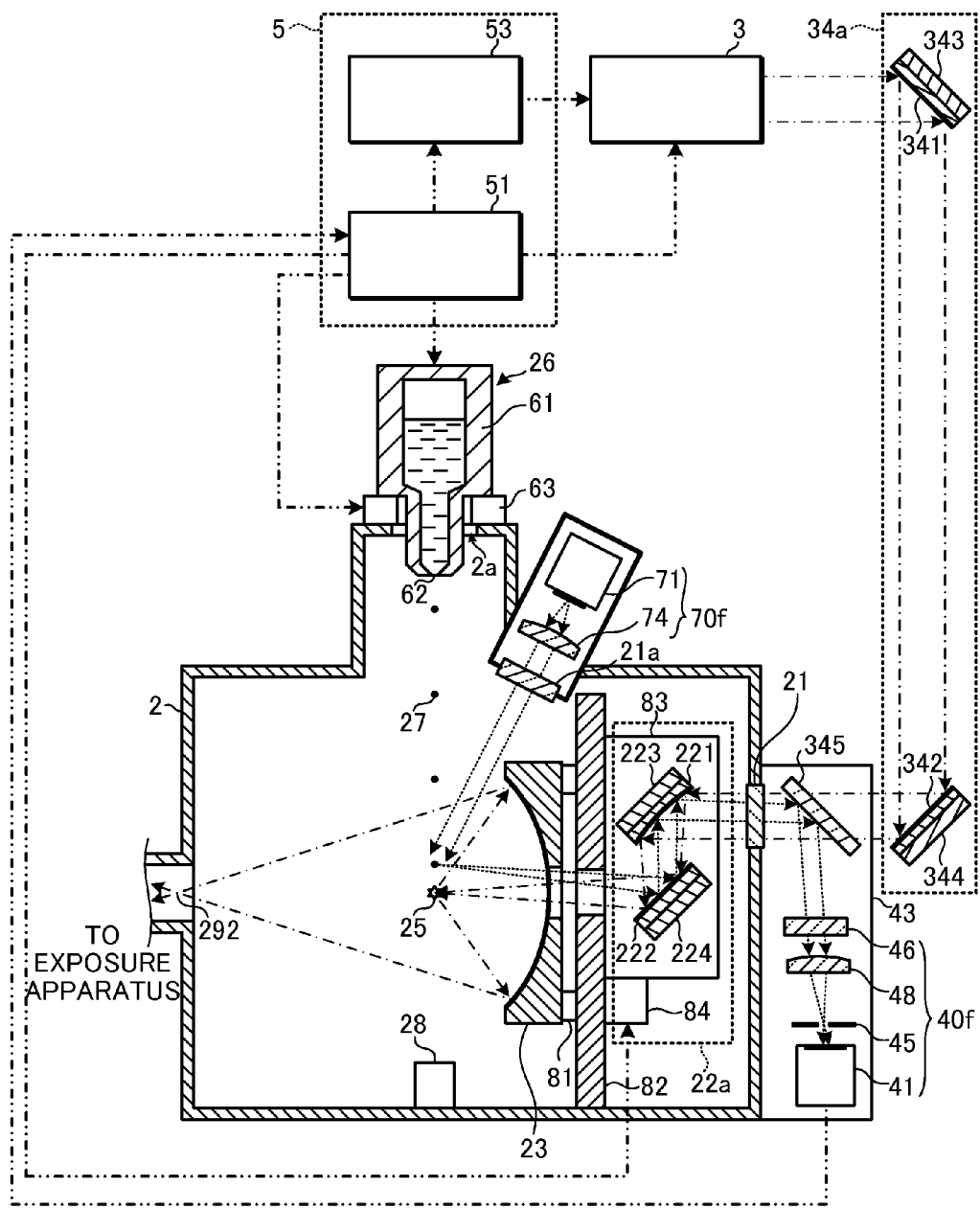
FIG. 15 is a partial cross-sectional view illustrating a configuration of an EUV light generation device in the second embodiment.

FIG. 15 is a partial cross-sectional view illustrating a configuration of an EUV light generation device in the second embodiment. In the second embodiment, a light-emitting unit 70f may be attached to the chamber 2, and a target sensor 40f may be disposed near the optical path of a pulse laser beam.

The light-emitting unit 70f may include a light source 71 and a collimator 74. Light outputted by the light source 71 may be guided by the collimator 74 to a predetermined position on a trajectory of a target 27 and the periphery thereof. The predetermined position may be a position that is slightly distant from the plasma generation region 25 toward an upstream side of the trajectory of the target 27. For example, the predetermined position may be a position that is 500 μm to 1000 μm away from the plasma generation region 25 toward an upstream side of the trajectory of the target 27.

A portion of light with which a target 27 has been irradiated by the light-emitting unit 70f and which has been reflected by the target 27 may be incident on the laser beam focusing optical system 22a in the opposite direction to the travelling direction of the pulse laser beam from the laser apparatus 3. The optical path of the light reflected by the target 27 and incident on the laser beam focusing optical system 22a can be equal to the light path of light from a single point light source placed at the predetermined position. Therefore, a portion of light reflected by the target 27 can be turned into substantially parallel light by the laser beam focusing optical system 22a to travel through the window 21.

A beam splitter 345 may be disposed on the optical path of the pulse laser beam between the laser beam direction control unit 34a and the laser beam focusing optical system 22a. The beam splitter 345 may cause a pulse laser beam (e.g. infrared light) outputted from the laser apparatus 3 to travel at a high transmittance from the right side to the left side of the drawing. Further, the beam splitter 345 may cause a portion of light (e.g. visible light) outputted from the light-emitting unit 70f and reflected by the target 27 to be reflected at a high reflectance to the lower side of the drawing.

A target sensor 40f may be disposed on the optical path of the light reflected to the lower side of the drawing by the beam splitter 345. The target sensor 40f may include an optical sensor 41, a slit plate 45, a bandpass filter 46, and an imaging optical system 48. A transfer optical system may be constituted by the aforementioned laser beam focusing optical system 22a and the imaging optical system 48 of the target sensor 40f. This transfer optical system may cause an image of the irradiated surface of the target 27 irradiated with the light from the light-emitting unit 70f to be formed in a slit of the slit plate 45 or a position therearound. The light having passed through the slit of the slit plate 45 may be incident on the optical sensor 41.

The second embodiment allows the target sensor 40f to detect the target 27 at a position (the predetermined position) that is closer to the plasma generation region 25 than the first embodiment does. Therefore, even if there are some variations in the velocity v of targets 27, the timing when a target 27 reaches the plasma generation region 25 can be calculated with a high degree of accuracy.

Further, according to the second embodiment, when the position of the point of focus of the laser beam focusing optical system 22a is moved in accordance with a change in the targeted position (Xt, Yt, Zt) where the EUV light is to be generated, the position of the target 27 to be detected (the predetermined position on the trajectory of the target 27) can move together. Therefore, in this case, the process of resetting the delay time (the process of steps S5 to S7 of FIG. 4) can be omitted.

In other respects, the second embodiment may be the same as the second modification of the first embodiment described with reference to FIGS. 6A to 6D.

Figure 16:
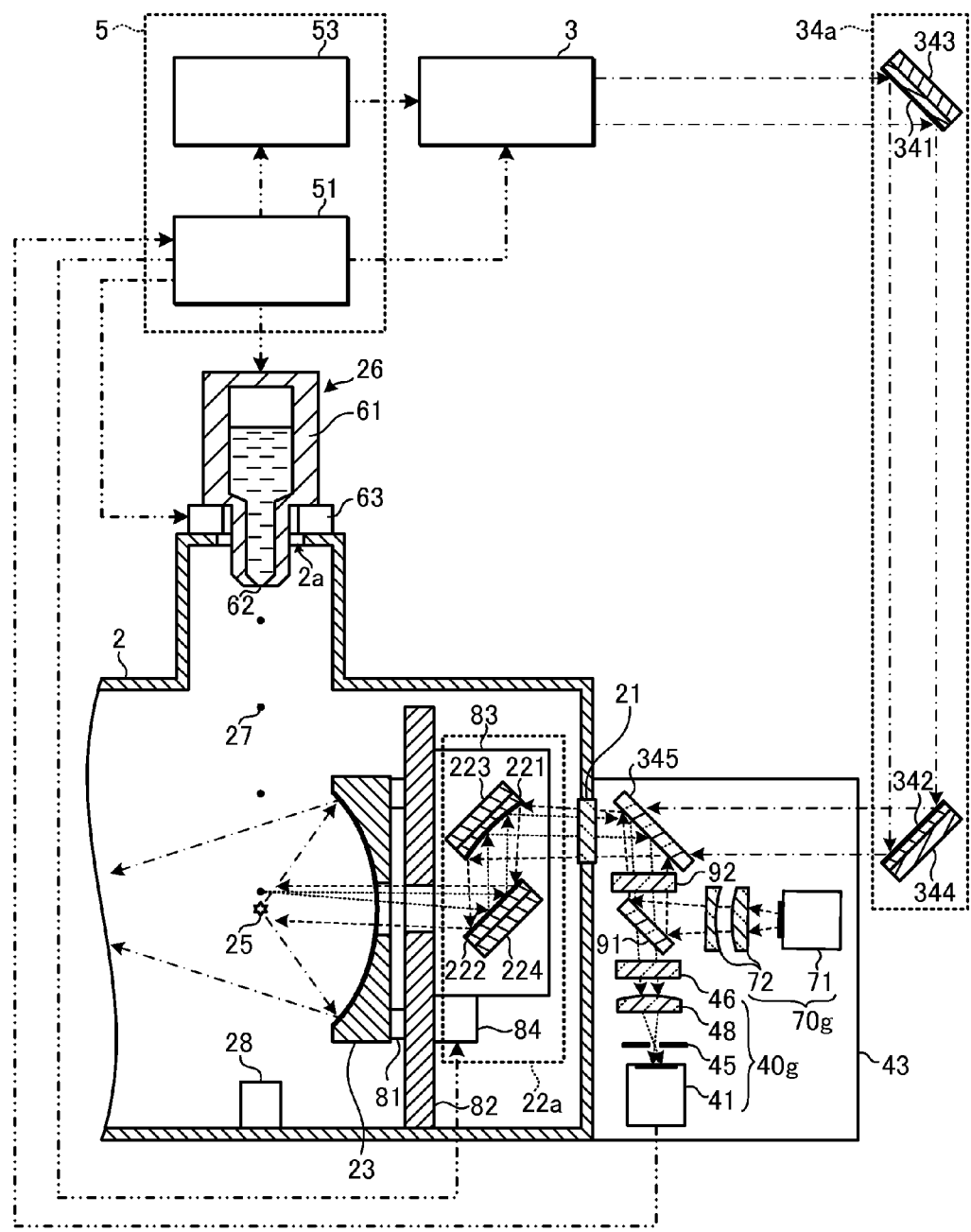
FIG. 16 is a partial cross-sectional view illustrating a configuration of an EUV light generation device in the third embodiment.

6. Third Embodiment Light-Emitting Unit Using Laser Beam Focusing Optical System FIG. 16 is a partial cross-sectional view illustrating a configuration of an EUV light generation device in the third embodiment. In the third embodiment, a light-emitting unit 70g, as well as a target sensor 40g, can be disposed near the optical path of a pulse laser beam. FIG. 16 omits to illustrate an EUV light output side end of the chamber 2. However, the EUV light output side end may be the same as that shown in FIG. 15. Further, FIG. 16 omits to illustrate the optical path of a pulse laser beam having traveled through the beam splitter 345. However, the optical path may be the same as that shown in FIG. 15.

A polarizing beam splitter 91 may be disposed between the beam splitter 345 and the target sensor 40g. A quarter wavelength plate 92 may be disposed between the beam splitter 345 and the polarizing beam splitter 91. The light-emitting unit 70g may be disposed so that light generated by the light-emitting unit 70g is reflected by the polarizing beam splitter 91 toward the quarter wavelength plate 92.

The light-emitting unit 70g may irradiate the polarizing beam splitter 91 with linearly-polarized light polarized in a direction perpendicular to the plane of paper. The light with which the light-emitting unit 70g irradiates the polarizing beam splitter 91 may have a predetermined spread angle (i.e. may have a convex wave front). The polarizing beam splitter 91 may reflect, at a high reflectance, linearly-polarized light polarized in a direction perpendicular to the plane of paper. The light reflected by the polarizing beam splitter 91 may be converted into circularly-polarized light by traveling through the quarter wavelength plate 92. The light converted into circularly-polarized light may be reflected by the beam splitter 345 and guided by the laser beam focusing optical system 22a to the plasma generation region 25 and the periphery of the trajectory of a target 27 in the vicinity thereof. The diameter of a cross-section of this optical path may for example be 2 mm to 3 mm in the vicinity of the plasma generation region 25.

A portion of the light with which the target 27 has been irradiated by the light-emitting unit 70g and which has been reflected by the target 27 may be incident on the quarter wavelength plate 92 through the laser beam focusing optical system 22a and the beam splitter 345. The circularly-polarized light incident on the quarter wavelength plate 92 may be converted into linearly-polarized light polarized in a direction parallel to the plane of paper and be incident on the polarizing beam splitter 91. The polarizing beam splitter 91 may cause the linearly-polarized light polarized in a direction parallel to the plane of paper to be transmitted at a high transmittance and be incident on a target sensor 40g.

A transfer optical system may be constituted by the laser beam focusing optical system 22a and an imaging optical system 48 of the target sensor 40g. This transfer optical system may cause an image of the irradiated surface of the target 27 irradiated with the light from the light-emitting unit 70f to be formed in a slit of the slit plate 45 or a position therearound. For example, when there exists a target 27 at a position that is about 1 mm away from the plasma generation region 25 toward an upstream side of the trajectory of the target 27, an image of the target 27 may be formed at a position within the slit of the slit plate 45. The light having passed through the slit of the slit plate 45 may be incident on the optical sensor 41.

According to the third embodiment, the laser beam focusing optical system 22a is used both on the optical path from the light-emitting unit 70g to the position of the target 27 and the optical path from the position of the target 27 to the target sensor 40g. Therefore, the light with which the target 27 is irradiated from the light-emitting unit 70g and the light reflected from the target 27 toward the target sensor 40g can travel in substantially the opposite directions to each other in the vicinity of the target 27. Through this, the image of the target 27 as detected by the target sensor 40g can be made clear.

In other respects, the third embodiment may be the same as the second embodiment described with reference to FIG. 15.

7. Fourth Embodiment

Figure 17:
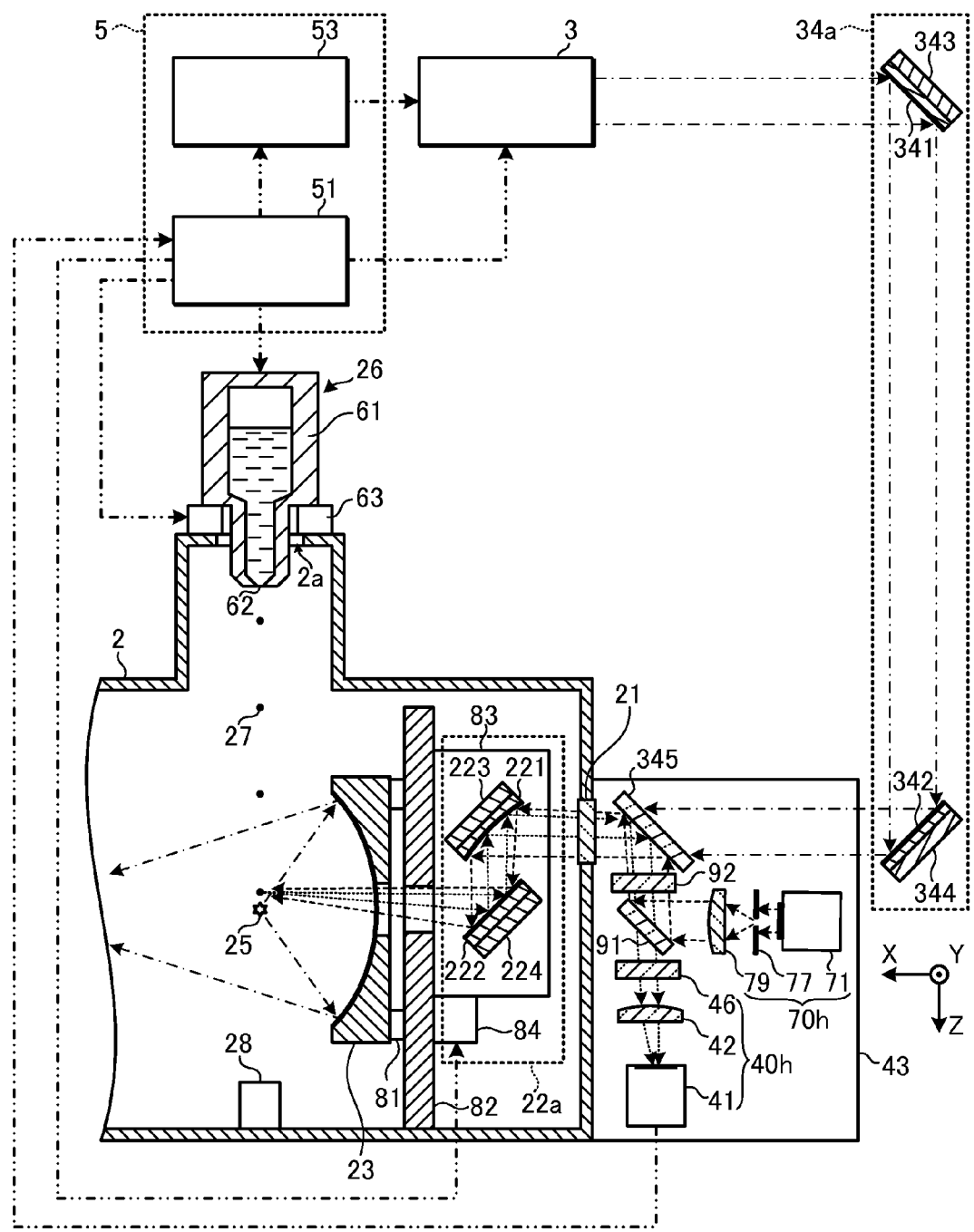
FIG. 17 is a partial cross-sectional view illustrating a configuration of an EUV light generation device in the fourth embodiment.

FIG. 17 is a partial cross-sectional view illustrating a configuration of an EUV light generation device in the fourth embodiment. In the fourth embodiment, the light path from a light-emitting unit 70h to a target sensor 40h may be substantially the same as that of the third embodiment described with reference to FIG. 16. In the fourth embodiment, the light-emitting unit 70h may include a slit plate 77 and a collimator 79. The target sensor 40h does not need to include a slit plate.

A transfer optical system may be constituted by the laser beam focusing optical system 22a and the collimator 79 of the light-emitting unit 70h. This transfer optical system may cause an image of a slit 77a (FIG. 8A, FIG. 8B) of the slit plate 77 to be formed in a region including part of the trajectory of a target 27. The region where this image is formed (second predetermined region) can be a rectangular region that is longer along the Y direction than along the Z direction. The target 27 can be detected by the target sensor 40h detecting light reflected by the target 27.

The above-described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more."

The invention claimed is:

1. An extreme ultraviolet light generation method for generating extreme ultraviolet light, comprising:
   outputting a target from a target supply device toward a first predetermined region inside a chamber, the chamber being provided with a through-hole;
   detecting the target passing through a second predetermined region by irradiating the second predetermined region with light and by detecting light incident on an optical sensor from the second predetermined region, the second predetermined region including part of a trajectory of the target between the target supply device and the first predetermined region, and the second predetermined region being a region that is longer along a direction perpendicular to a direction of movement of the target and perpendicular to an optical path of the light with which the second predetermined region is irradiated than along the direction of movement of the target; and
   irradiating the target with a pulse laser beam introduced into the first predetermined region through the through-hole, on a basis of a timing of detecting the target passing through the second predetermined region, to turn the target into plasma.

2. An extreme ultraviolet light generation device configured to generate extreme ultraviolet light by turning a target into plasma by irradiating the target with a pulse laser beam, comprising:
   a chamber provided with a through-hole;
   an introduction optical system configured to introduce the pulse laser beam into a first predetermined region inside the chamber through the through-hole;
   a target supply device configured to output the target toward the first predetermined region; and
   a target sensor configured to detect the target passing through a second predetermined region by irradiating the second predetermined region with light and by detecting light incident on the target sensor from the second predetermined region, the second predetermined region including part of a trajectory of the target between the target supply device and the first predetermined region, and the second predetermined region being a region that is longer along a direction perpendicular to a direction of movement of the target and perpendicular to an optical path of the light with which the second predetermined region is irradiated than along the direction of movement of the target.

3. An extreme ultraviolet light generation device configured to generate extreme ultraviolet light by turning a target into plasma by irradiating the target with a pulse laser beam, comprising:
   a chamber provided with a through-hole;
   an introduction optical system configured to introduce the pulse laser beam into a first predetermined region inside the chamber through the through-hole;
   a target supply device configured to output the target toward the first predetermined region;
   a light source configured to irradiate a second predetermined region with light whose optical path in the second predetermined region has a transverse section that is longer along a direction perpendicular to a direction of movement of the target than along the direction of movement of the target, the second predetermined region including part of a trajectory of the target between the target supply device and the first predetermined region; and
   an optical sensor configured to detect light incident on the optical sensor from the second predetermined region to detect the target passing through the second predetermined region.

4. The extreme ultraviolet light generation device according to claim 3, wherein the optical sensor is configured to detect the light passing through a periphery of the target which is passing through the second predetermined region.

5. The extreme ultraviolet light generation device according to claim 3, wherein the optical sensor is configured to detect the light reflected by the target which is passing through the second predetermined region.

6. An extreme ultraviolet light generation device configured to generate extreme ultraviolet light by turning a target into plasma by irradiating the target with a pulse laser beam, comprising:
- a chamber provided with a through-hole;
- an introduction optical system configured to introduce the pulse laser beam into a first predetermined region inside the chamber through the through-hole;
- a target supply device configured to output the target toward the first predetermined region;
- a light source configured to irradiate a second predetermined region with light, the second predetermined region including part of a trajectory of the target between the target supply device and the first predetermined region;
- a transfer optical system configured to form an image of the target passing through the second predetermined region; and
- an optical sensor being disposed at a position where the image of the target is formed by the transfer optical system, an optical sensor being configured to detect light incident on a third predetermined region from the transfer optical system to detect the target passing through the second predetermined region, the third predetermined region being longer along a direction perpendicular to a direction of movement of the target than along the direction of movement of the target.

7. The extreme ultraviolet light generation device according to claim 6, wherein the optical sensor comprises:
- a slit plate being disposed at the position where the image of the target is formed by the transfer optical system, the slit plate having a slit which allows passage of the light incident on the third predetermined region, the slit plate controlling passage of light incident on a periphery of the third predetermined region; and
- a light-receiving element that detects light having passed through the slit.

8. The extreme ultraviolet light generation device according to claim 6, wherein the optical sensor comprises a light-receiving element being disposed at the position where the image of the target is formed by the transfer optical system, the light-receiving element having a light-receiving unit in the third predetermined region and detecting the light incident on the third predetermined region.

9. The extreme ultraviolet light generation device according to claim 7, wherein the transfer optical system is configured to form an image of a target located between the light source and the transfer optical system.

10. The extreme ultraviolet light generation device according to claim 7, wherein the transfer optical system is configured to form an image of a surface of the target irradiated with the light by the light source.

* * * * *